United States Patent [19]

Komatsu et al.

[11] Patent Number: 5,070,250
[45] Date of Patent: Dec. 3, 1991

[54] POSITION DETECTION APPARATUS WITH ADJUSTABLE BEAM AND INTERFERENCE FRINGE POSITIONS

[75] Inventors: Koichiro Komatsu, Tokyo; Hideo Mizutani, Yokohama; Nobutaka Magome, Kawasaki; Kazuya Ota, Tokyo, all of Japan

[73] Assignee: Nikon Corporation, Tokyo, Japan

[21] Appl. No.: 649,340

[22] Filed: Feb. 1, 1991

Related U.S. Application Data

[63] Continuation of Ser. No. 482,557, Feb. 21, 1990, abandoned.

[30] Foreign Application Priority Data

Feb. 28, 1989 [JP] Japan ................................ 1-48295
Jun. 5, 1989 [JP] Japan ................................ 1-142377

[51] Int. Cl.$^5$ ............................................. G01N 21/86
[52] U.S. Cl. .................................... 250/548; 250/557; 356/401
[58] Field of Search ................ 250/548, 557; 356/249, 356/351, 356, 363, 399–401

[56] References Cited

U.S. PATENT DOCUMENTS

4,616,130 10/1986 Omata ................................ 250/548
4,710,026 12/1987 Magome et al. .................... 356/349
4,801,808 1/1989 Hamasaki .......................... 250/548

FOREIGN PATENT DOCUMENTS

62-261003 11/1987 Japan .
63-283129 11/1987 Japan .

Primary Examiner—David C. Nelms
Assistant Examiner—K. Shami
Attorney, Agent, or Firm—Shapiro and Shapiro

[57] ABSTRACT

A position detection apparatus has a substrate on which a diffraction grating is formed and an alignment optical system for illuminating the diffraction grating with a pair of coherent light beams having different frequencies from each other from different directions. The intensity of interference fringes formed due to the interference of diffracted beams generated in the diffraction grating is detected photo-electrically. The alignment optical system forms the pair of coherent light by using an optical modulator, and two luminous fluxes from the optical modulator pass through independent optical paths positioned symmetrically with the optical axis of the alignment optical system therebetween and reach the diffraction grating from different directions. The alignment optical system has a stop having an opening having an inclined edge with respect to the direction of the grating components of the diffraction grating, the opening being in conjugation with the substrate.

2 Claims, 17 Drawing Sheets

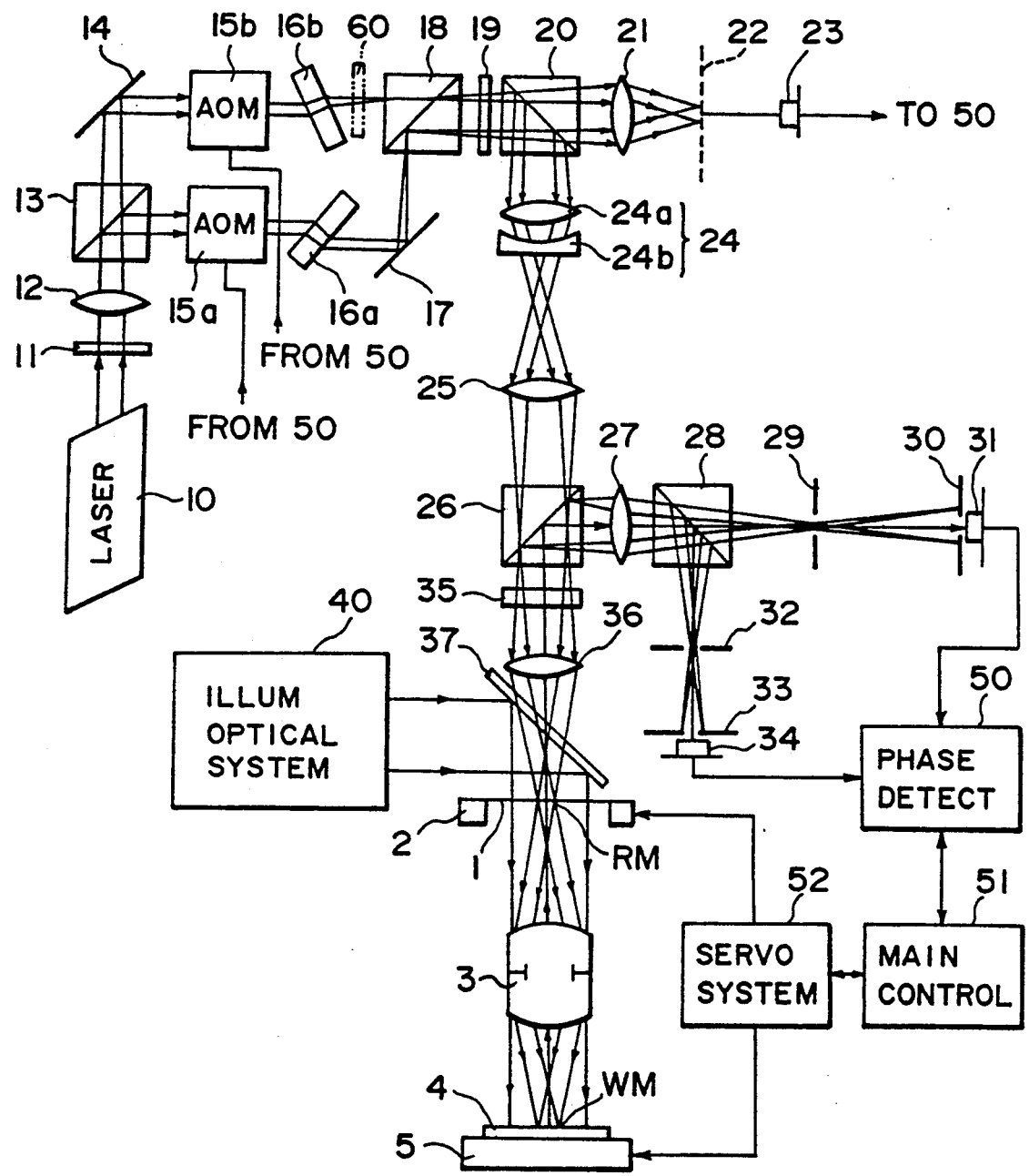
F I G. 1

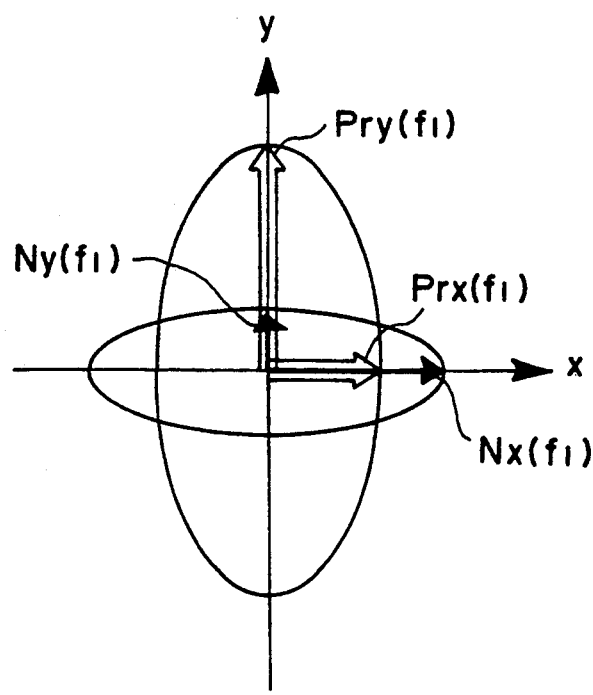
F I G. 4
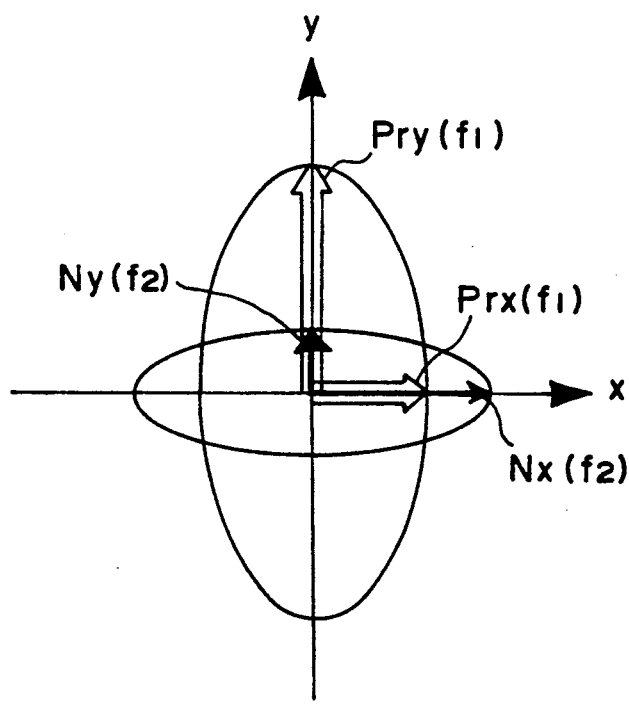
F I G. 7

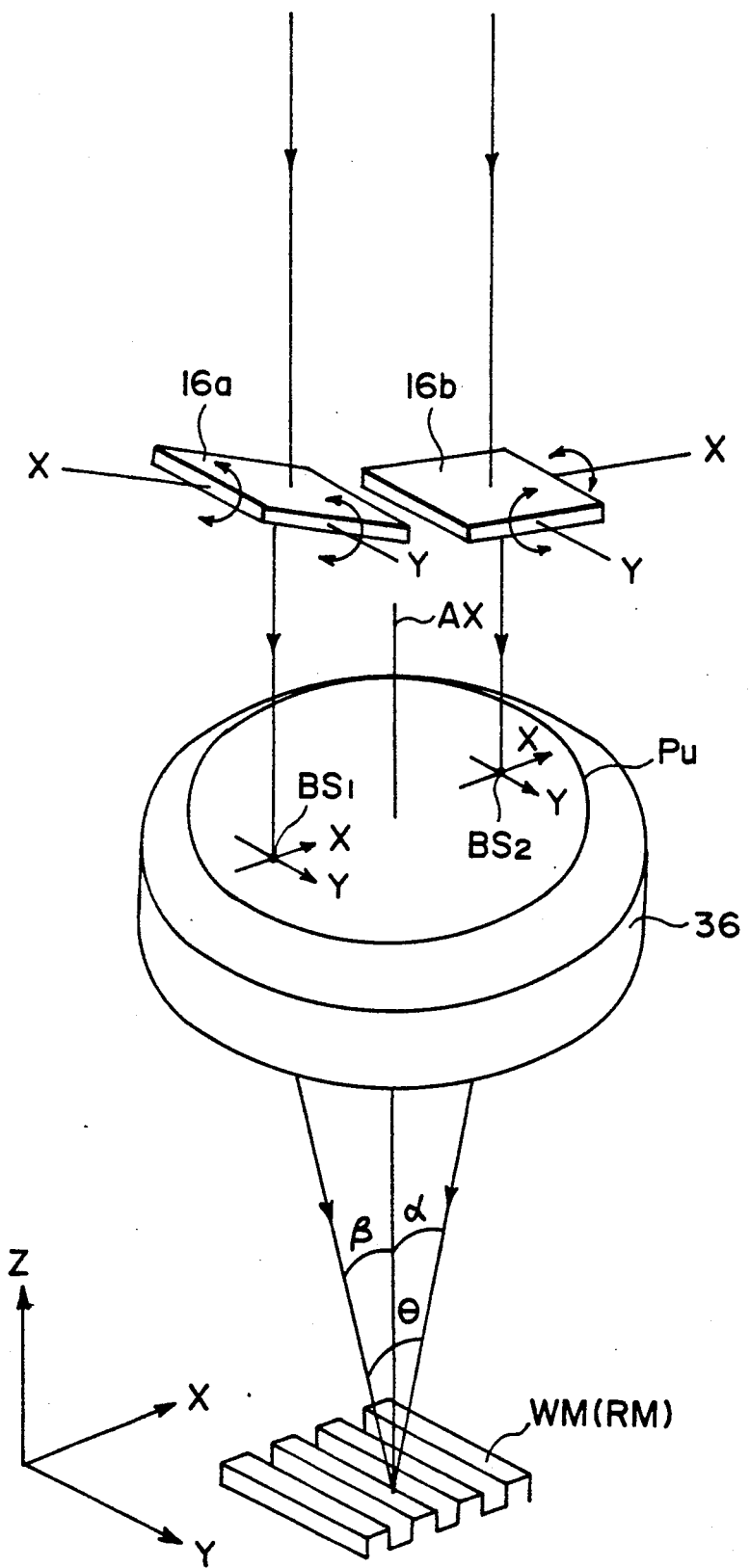
F I G. 5

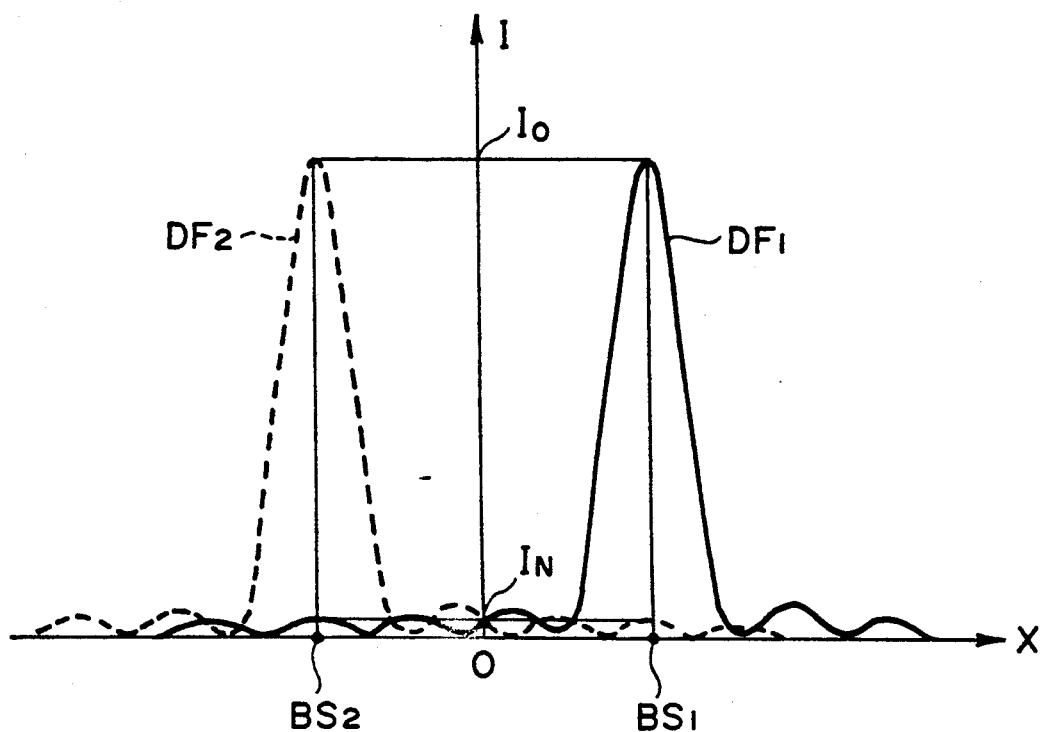
F I G. 10
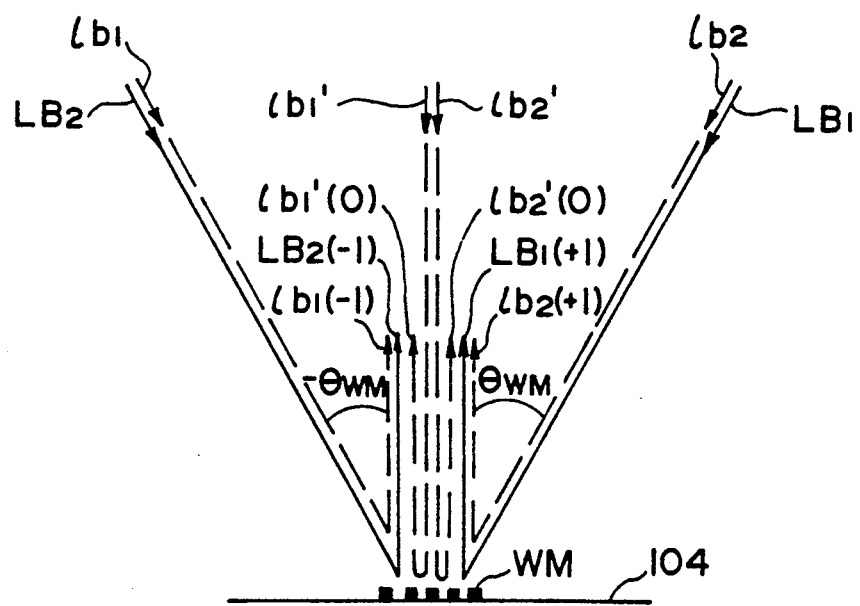
F I G. 11

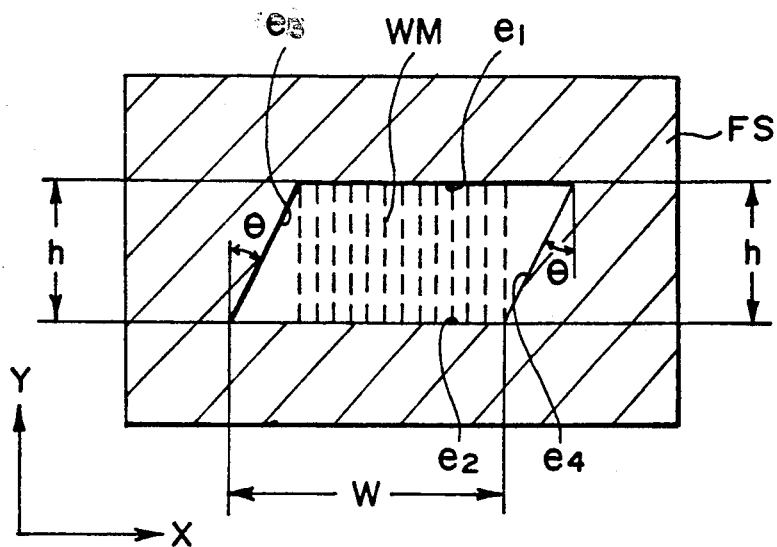
F I G. 14
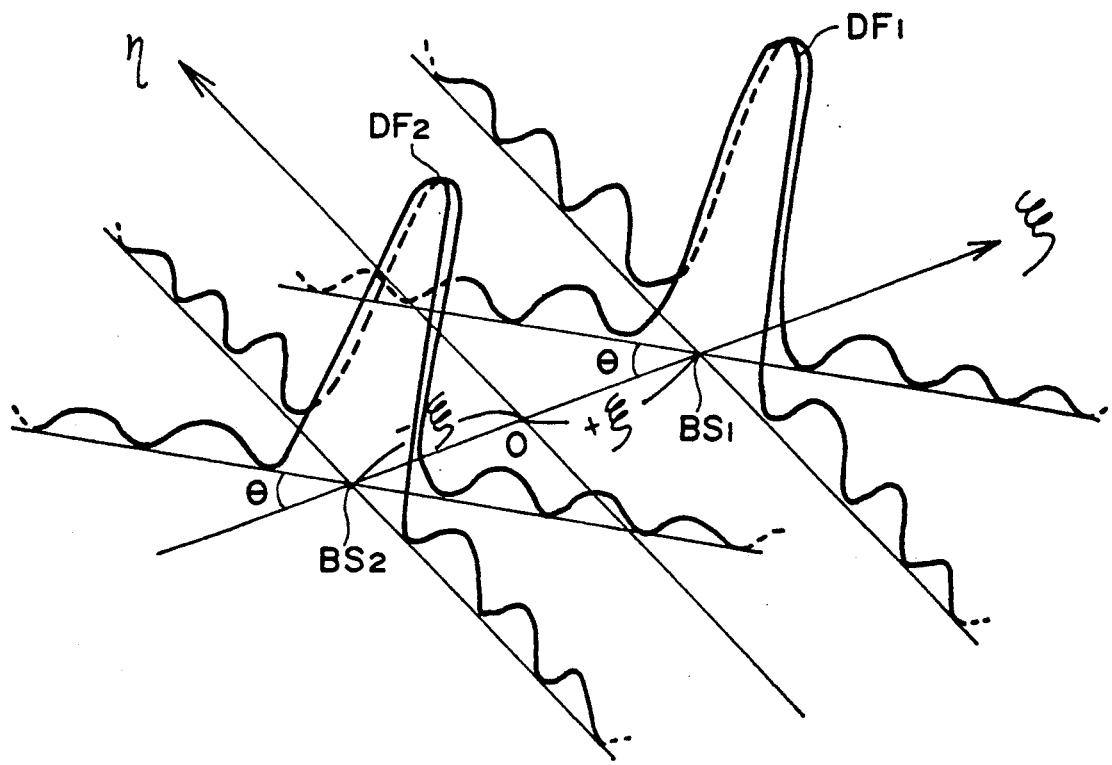
F I G. 15

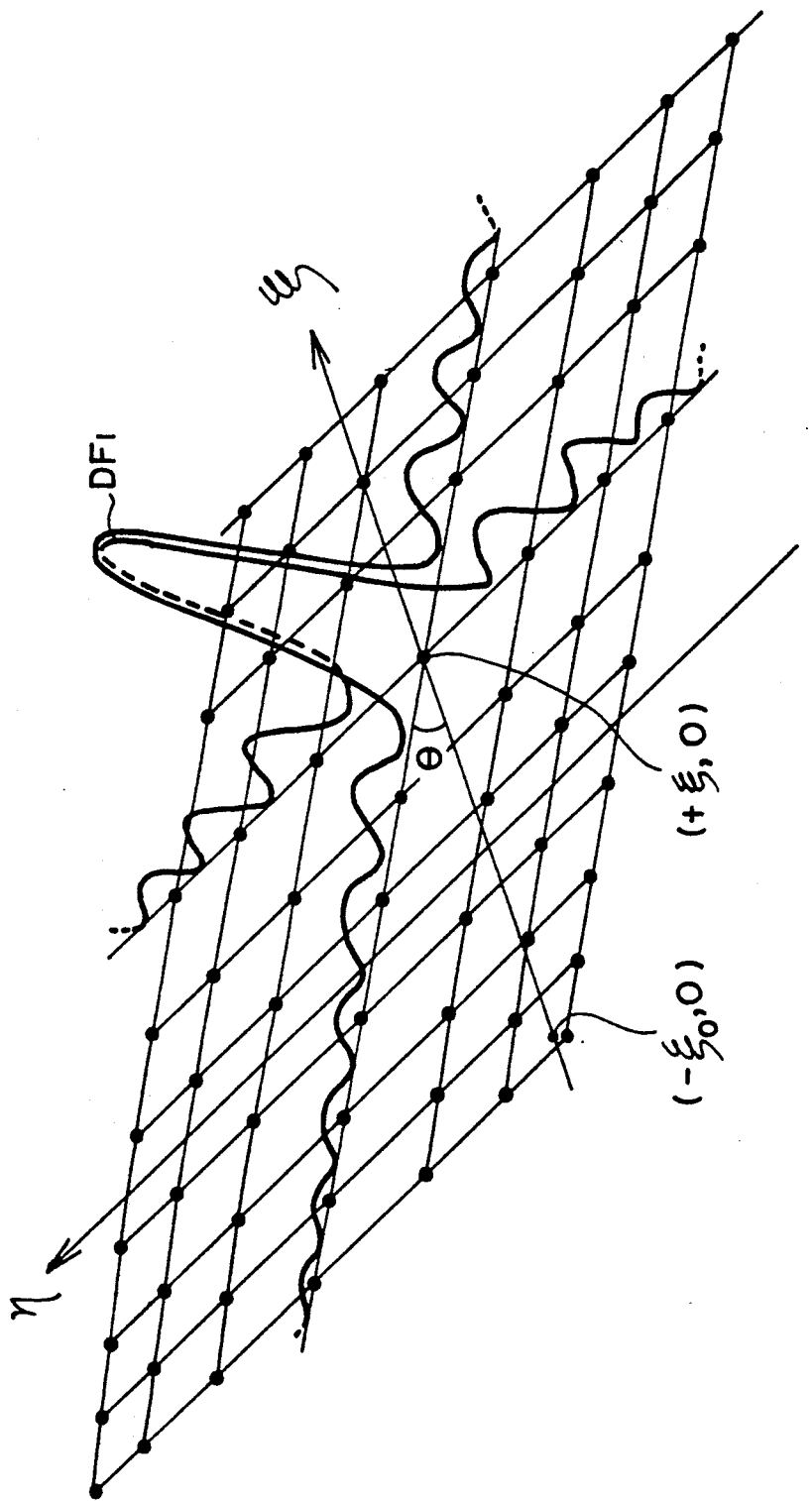
F I G. 16

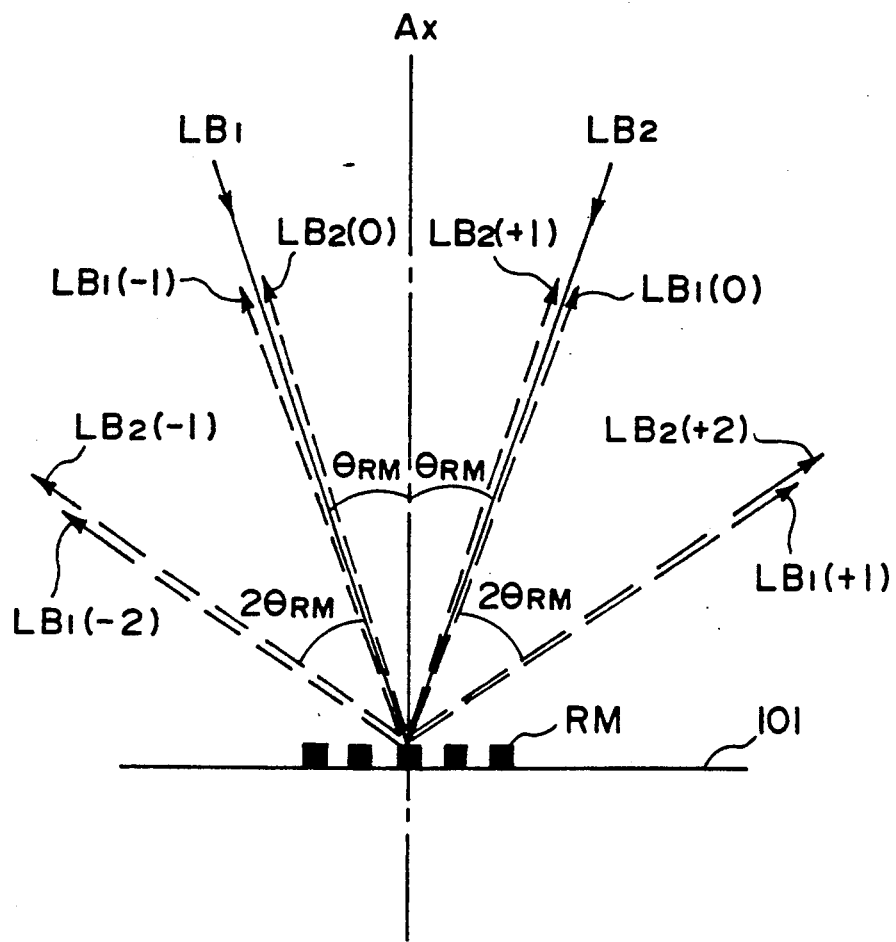
F I G. 24

POSITION DETECTION APPARATUS WITH ADJUSTABLE BEAM AND INTERFERENCE FRINGE POSITIONS

This is a continuation of application Ser. No. 482,557 filed Feb. 21, 1990, now abandoned.

BACKGROUND OF THE INVENTION

1. Field of the Invention

The present invention relates to a heterodyne coherent type position detection apparatus, and, more particularly, to an apparatus suitably used for accurate alignment in an apparatus for manufacturing semiconductors.

2. Related Background Art

In recent years, a projection type exposing apparatus, so-called a stepper has been widely used as an apparatus for transcribing fine patterns on the surface of a semiconductor devices or the like onto the wafer of a semiconductor. In particular, since high density mount LSIs manufactured by the above-described technology have been desired recently, finer pattern must be transcribed to wafers. In order to achieve this, more accurate alignment is necessary.

An accurate position detection apparatus in accordance with the heterodyne coherent method is known, as disclosed in, for example, Japanese Patent Laid-Open No. 62-261003 and U.S. Pat. No. 4,710,026.

The former apparatus is arranged in such a manner that its aligning light source comprises a Zeeman laser utilizing a Zeeman effect which emits luminous flux including p-polarized light and s-polarized light having slightly different frequencies. The luminous flux emitted from the Zeeman laser is, by a polarizing beam splitter, divided into two fluxes: p-polarized light having a frequency of $f_1$ and s-polarized light having a frequency of $f_2$. The thus formed two fluxes irradiate a diffraction grating mark formed on a reticle (or a mask) from predetermined two directions via two corresponding reflecting mirrors. Since the mask has an opening neighboring the diffraction grating mark, a portion of each of the two fluxes can, from predetermined two directions, irradiate the diffraction grating mark formed on the wafer after passing through the opening.

As a result, the diffraction grating mark on the mask and that on the wafer respectively generate diffracted beams. The diffracted beams (p-polarized light and s-polarized light) emitted from the mask mark interfere with each other via a polarizing plate. As a result, a single optical beat signal is generated. Also the diffracted beams from the wafer mark interfere with each other via the polarizing plate. As a result, another optical beat signal is generated. The thus generated two optical beat signal are photoelectrically detected so that the relative phase difference between the two signals is detected. Since the phase difference corresponds to the quantity of deviation between the two luminous fluxes intersecting on the diffraction grating mark and the substrate, an accurate alignment can be achieved by relatively moving the reticle and the wafer in such a manner that the phase difference becomes zero.

However, the above described conventional apparatuses arise a problem in that an error takes place due to the following factors:

The first factor lies in that the perfect splitting of polarized beams cannot be achieved if a slight positional deviation from the designed positions takes place between the active plane of a polarization beam splitter of a polarization splitting device such as the above-described polarization beam splitter for splitting two polarized beams from the Zeeman light source and the polarizing plane on which the two polarized beams are made incident. As a result, the split luminous flux includes not only the main polarized beam component but also a small quantity of the other polarized beam component, that causes noise.

The above-described positional deviation is caused by errors that have mainly taken place at the time of manufacturing the semiconductors. However, the polarization splitting device such as the polarization beam splitter cannot perfectly split p-polarized light and s-polarized light. Therefore, even if the optical system comprising the above-described devices can be mounted without the manufacturing errors, each of polarized beams which has been split includes a small quantity of noise which is different in the polarization component and in the frequency from the main polarized beam component. The split polarized beams become coherent each other so that an optical beat is generated between the main polarized beam component and the noise component, causing an excessive error to appear in the optical beat signal which has been photoelectrically detected.

A second factor is caused by the fact that linearly polarized luminous flux is, strictly, deformed into elliptically polarized light due to the passage of the flux through optical devices such as a polarization beam splitter and a reflecting mirror. Usually, a laser beam emitted from a light source reaches the diffraction grating mark on the mask or on the reticle after it has been subjected to one or more reflections. During the process of the passage of the laser beam, a noise factor of the type shown in FIGS. 4 and 7 is generated That is, noise component Pr (frequency: $f_1$) is generated in direction x which is perpendicular to main polarized beam component Pry (frequency: $f_1$) in direction y. Furthermore, noise component Ny (frequency: $f_2$) is generated in direction y which is perpendicular to noise component Nx (frequency: $f_2$) in direction x. Although the noise components (Prx and Nx) which are generated perpendicularly to the main polarizing direction can be eliminated, the noise component Ny in the same direction as main polarized beam component Pry cannot be eliminated. Therefore, beats generate between the main polarized beam component Pry (frequency: $f_1$) and the noise component Ny (frequency: $f_2$) in the same direction as the main polarized beam component Pry, causing the optical beam signal whose position is to be detected to include an excessive error.

Now, the above-described problem will be analyzed with reference to the two diffracted beams to be photoelectrically detected.

The amplitude $D_1$ of the diffracted light consisting of the main polarized beam component having the frequency of $f_1$ and the noise component having the frequency of $f_2$ included in the main polarized beam component can be expressed as follows:

$$D_1 = U_1 \exp[-i(k_1 t - \phi_1)] + V_2 \exp[-i(k_2 t - \phi_2)] \quad (1)$$

On the other hand, the amplitude $D_2$ of the diffracted light consisting of the main polarized beam component having the frequency of $f_2$ and the noise component having the frequency of $f_1$ included in the main polarized beam component can be expressed as follows:

$$D_2 = U_2 \exp[-i(k_2t+\phi_2)] + V_1 \exp[-i(k_1t+\phi_1)] \quad (2)$$

where $U_1$ and $V_2$ respectively represent the amplitude of the main polarized beam component (frequency: $f_1$) and that of the noise component (frequency: $f_2$) of the diffracted light having the amplitude $D_1$, $U_2$ and $V_1$ respectively represent the amplitude of the main polarized beam component (frequency: $f_2$) and that of the noise component (frequency: $f_1$) of the diffracted light having the amplitude $D_2$, $k_1$ ($=2\pi f_1$) and $k_2$ ($=2\pi f_1$) represent the wave numbers, and $\phi_1$ and $\phi_2$ represent the phase changes generated when the diffracted beams which respectively have the frequencies $f_1$ and $f_2$ are subjected to the diffraction by means of the diffraction grating.

Intensity of the optical beam signal which is photoelectrically detected by a detector can be expressed as follows from thus obtained Equations (1) and (2):

$$I = |U_1 \exp[-i(k_1t - \phi_1)] + V_2 \exp[-i(k_2t - \phi_2)] + \quad (3)$$
$$U_2 \exp[-i(k_2t + \phi_2)] + V_1 \exp[-i(k_1t + \phi_1)]|^2$$

Expansion of Equation (3) gives $$I = U_1^2 + V_2^2 + U_2^2 + V_1^2 + 2U_1V_1 \cos(2\phi_1) + \quad (4)$$
$$2U_2V_2 \cos(2\phi_2) + 2U_1U_2 \cos[(k_1 - k_2)t + (\phi_1 + \phi_2)] +$$
$$2V_1V_2 \cos[(k_1 - k_2)t + (\phi_1 + \phi_2)] + 2U_1V_2 \cos[(k_1 - k_2)t -$$
$$(\phi_1 - \phi_2)] + 2U_2V_1 \cos[(k_1 - k_2)t + (\phi_1 - \phi_2)]$$

The optical beat signal obtained from Equation (4) originally includes only the phase component $\phi_1 + \phi_2$ representing the positional information of the diffraction grating. It is apparent that the optical beat signal further includes other phase components ($\phi_1 - \phi_2$) and ($-\phi_1 + \phi_2$). Assuming that $V_1$ and $V_2$ are sufficiently small with respect to $U_1$ and $U_2$, the phrase error e can be expressed by the following equation:

$$e = \tan^{-1} \frac{U_1V_2 + U_2V_1}{U_1U_2} \quad (5)$$

Assuming that the light intensity ratio of the polarized components perpendicular to each other and included in each of two luminous fluxes split by the above-described polarization beam splitter is 1:1000 ($|V_2|^2:|U_1|^2$ or $|U_2|^2:|V_1|^2$) and $U_1=U_2$ and $V_1=V_2$, the phase error e according to Equation (5) becomes $$e = \tan^{-1} \frac{\sqrt{1000V_1} \sqrt{V_2} + \sqrt{1000V_2} \sqrt{V_1}}{\sqrt{1000V_1} \sqrt{1000V_2}} \quad (6)$$
$$= \tan^{-1} \frac{\sqrt{1000} \sqrt{1} + \sqrt{1000} \sqrt{1}}{\sqrt{1000} \sqrt{1000}} \approx 3.6°$$

Therefore, the optical beat signal which is photoelectrically detected inevitably includes an error which cannot be disregarded.

The conventional apparatus has been arranged in such a manner that the pitch of interference fringes generated with the mark on the diffraction grating formed on the substrate is illuminated with two luminous fluxes having directions frequencies from two direction becomes half of the pitch of the diffraction gratings. Therefore, the phase difference between the optical beat signal including positional information of the diffraction grating mark and the reference optical beat signal changes by $2\pi$ whenever the relative deviation between the two luminous fluxes and the substrate becomes the half pitch. That is, the range which can be detected as the phase difference becomes $2\pi$.

Then, assuming that the pitch of the mark on the diffraction grating formed on the substrate is P, the above-described phase error e can be converted into the following relative deviation $\delta$ between the two luminous fluxes and the substrate:

$$\delta = \frac{P/2 \cdot e}{2\pi} \quad (7)$$

Assuming that the pitch P of the mark on the diffraction grating is 10 µm, the above-described phase error of 3.6° can be converted into the deviation $\delta$ expressed by:

$$\delta = \frac{5 \text{ µm} \times 3.6°}{360°} = 0.05 \text{ µm} \quad (8)$$

It is apparent that the above-described error cannot be disregarded.

When, for example, a 4-megabit VLSI is manufactured, a printing line width which is about 0.6 to 0.7 µm is necessary. In order to achieve this, the detector must have an accuracy of at least 10% (which is 0.06 to 0.07 µm) of the line width (about 0.6 to 0.7 µm). However, the error obtained in accordance with Equation (8) causes a difficulty in achieving an alignment at the time of subjecting 4-megabit VLSI to an exposure.

The above-described conventional apparatus has experienced another detection accuracy problem due to diffracted light from a field stop. In order to overcome the problem of this type, it is preferable that the field stop be positioned in conjugation with the position of a wafer in an optical system for transmitting alignment light when the above-described heterodyne type position detection is conducted. Thus, the illumination region of the mark on the diffraction grating of the wafer may be restricted. The reason for this is that the detector should be protected from reflected light acting as noise and generated when a portion of alignment light is applied to the pattern in the transcription region or another alignment mark.

SUMMARY OF THE INVENTION

An object of the present invention is to provide a position detection apparatus capable of obtaining a reliable and stable optical beat signal.

Another object of the present invention is to provide a position detection apparatus capable of accurately detecting the position.

The apparatus according to present invention has an alignment optical system for applying two luminous fluxes having different frequencies from each other from two directions to a diffraction grating formed on a substrate so as to be position-detected. Diffracted light beams generated from the two luminous fluxes are made to interfere with each other and the optical beat signal generated due to the interference. The alignment optical system comprises a light source for supplying luminous fluxes for illuminating the diffraction grating, a beam splitter for splitting the illuminating luminous fluxes into two portions, an optical modulator for modulating the frequency of each of the luminous fluxes which have been split into two portions by a predetermined value, and means for adjusting the optical path for the two luminous fluxes in such a manner that the split two luminous fluxes pass with the optical axis of the alignment optical system positioned therebetween.

As an aspect of the present invention, the optical path adjustment means has means for adjusting the intersection angle of the two luminous fluxes for illuminating the diffraction grating formed on the substrate and means for adjusting the direction of generation of the interference fringes.

According to the above-described position detection apparatus, the two luminous fluxes which have been modulated so as to have different frequencies always pass through different optical paths. Therefore, the noise component which degraded the detection signal can be eliminated. Therefore, a stable optical beat signal having high contrast can be obtained, causing an accurate alignment to be conducted. Furthermore, the optical paths for the two luminous fluxes can be adjusted, and the intersection angle of the two luminous fluxes for illuminating the diffraction grating mark formed on the substrate can be adjusted. In addition, the rotational deviation between the direction of the arrangement of the interference fringes and the direction of the arrangement (pitch) of the diffraction grating mark can be adjusted.

A further object of the present invention is to provide a position detection apparatus having a field stop which does not influence the detection accuracy at a conjugation position with the diffraction grating mark in the alignment optical system.

The apparatus according to the present invention has an alignment optical system for supplying two luminous fluxes for illuminating the diffraction grating mark from different directions, and stop means is positioned in conjugation with the diffraction grating mark of the alignment optical system so that the opening portion of the stop means is appropriately formed. The edge is formed in the longitudinal direction of the grating component of the diffraction grating.

It is preferable that the pair of confronting edges meet the following relationship assuming that the length of the edge forming the opening portion of the stop means is L, the pitch of the interference fringes formed on the stop is $P_{FS}$ and an integer is represented by m:

$L = mP_{FS}$.

It is preferable that the opening of the stop be formed in a parallelogram. Specifically, it is preferable that the following relationship be held:

$$\sin 2\theta \geq \frac{P_{FS}^2 P_{WM}}{\pi^3 wh X_{WM}}$$

where the inclination of said edge of said opening is $\theta$, the pitch of said interference fringes formed on said stop means is $P_{FS}$, the pitch of said diffraction grating is $P_{WM}$, the length of said edge of said opening of said stop means extending in said direction corresponding to said direction of said arrangement of said diffraction grating is W, the length of said edge of said opening of said stop means extending in a direction corresponding to a groove of said diffraction grating is h and allowable detected error on said substrate is $X_{WM}$.

A light shield means may be formed at a position closer to the diffraction grating than the position of the stop means for the purpose of shielding diffracted light from the stop.

It is further preferable that the following relationship be held.

$$\sin 2\theta \geq \frac{4 P_{FS}^2 P_{WM}}{\pi^3 wh X_{WM}}$$

Other and further objects, features and advantages of the invention will appear more fully from the following description.

BRIEF DESCRIPTION OF THE DRAWINGS

FIG. 1 illustrates the schematic structure of a first embodiment of a projection exposing apparatus according to the present invention;

FIG. 4 illustrates a state in which the main polarized component and the noise component having the same frequency are elliptically polarized;

FIG. 5 is a perspective view which schematically illustrates the optical path adjustment function;

FIG. 7 illustrates a state in which the main polarized beam component of the noise component having a different frequency are elliptically-polarized;

FIG. 10 illustrates the intensity distribution of diffracted light;

FIG. 11 illustrates generation of diffracted light by the diffraction grating mark of the wafer;

FIG. 14 is a plan view which illustrates the FS (Field Stop) shown in FIG. 8;

FIG. 15 illustrates the secondary intensity distribution of alignment beams $LB_1$ and $LB_2$ on a pupil surface of a projecting lens;

FIG. 16 illustrates the secondary intensity distribution of alignment beam $LB_1$ on a pupil surface of a projecting lens;

FIG. 24 illustrates generation of diffracted light on the diffraction grating mark of the wafer.

DETAILED DESCRIPTION OF THE PREFERRED EMBODIMENTS

Figure 2A:
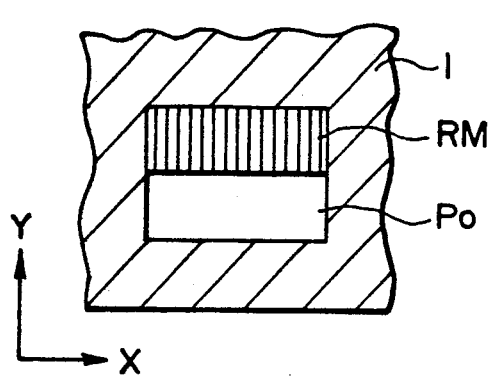
FIG. 2A is a plan view which illustrates a diffraction grating mark RM on a reticle.

FIG. 1 illustrates the schematic structure of a first embodiment of a position detection apparatus according to the present invention.

A reticle (a mask) 1 having a predetermined circuit pattern and an alignment diffraction grating mark RM is held by a reticle stage 2 which can be moved two dimensionally. Patterns on the reticle 1 are imaged on a wafer 4 (a substrate) with exposing light emitted from an illuminating optical system 40 by a projecting objective lens 3. Also the wafer has a diffraction grating mark WM similar to the diffraction grating mark RM formed on the reticle 1.

The wafer is absorbed onto the stage 5 which is moved two-dimensionally in accordance with a step-and-repeat method until the transcription of the pattern on the reticle 1 in a single shot region on the wafer is completed. Then, the wafer is stepped to the next shot position. An independent interferometer (omitted from illustration) is provided for each of the stages so that x-directional, y-directional and rotational ($\theta$) positions on the reticle stage 2 and the wafer stage 5 are detected. The stages are moved in each of the predetermined directions by an operating motor (omitted from illustration).

Exposing light supplied from an exposing illumination optical system 40 is reflected downwards by a dichroic mirror 37 or the like diagonally positioned above the reticle 1 by 45° so that the reticle 1 is uniformly illuminated. The pattern on the reticle 1 which is being illuminated uniformly is imaged on the wafer by the projecting lens 3.

An alignment optical system 10 to 31 for detecting position is provided above the dichroic mirror 37.

Now, the alignment optical system will be described.

Aligning illumination light having a wavelength different from that of the above-described exposing light becomes circularly-polarized light by a quarter wavelength plate 11 after it has been emitted from a laser light source 10. A luminous flux is divided into p-polarized light and s-polarized light having the same light quantity by a polarization beam splitter 13 after it has passed through a lens 12.

The s-polarized luminous flux reflected by the polarization beam splitter 13 is made incident upon a first acoustooptic modulator 15a (to be called simply "an AOM 15a" hereinafter). On the other hand, p-polarized luminous flux which has passed through the polarization beam splitter 13 is made incident upon a second acoustooptic modulator 15b (to be called simply "an AOM 15b" hereinafter) via a reflecting mirror 14. The AOMs respectively modulate the frequency of the p-polarized luminous flux into $f_1$ and that of the s-polarized luminous flux into $f_2$ so as to cause the frequency difference between the p-polarized luminous flux and the s-polarized luminous flux to be made $\Delta f$. The s-polarized luminous flux whose frequency has been modulated into f1 by the AOM 15a reaches a polarization beam splitter 18 via a parallel plane plate 16a and a reflecting mirror 17. On the other hand, the p-polarized luminous flux whose frequency has been modulated into $f_2$ reaches the beam splitter 18 via a parallel plane plate 16b.

The parallel plane plates 16a and 16b serve as optical path adjustment means and are inclined with respect to a direction are the two luminous fluxes whose frequencies have been modulated into different frequencies so that the two luminous fluxes are not again synthesized by the beam splitter 18, the degree of inclination being arranged to be adjustable. As a result, the optical paths for the two luminous fluxes whose frequencies have been modulated by the corresponding AOMs are shifted by a predetermined quantity so that the two luminous fluxes pass through the polarization beam splitter 18 separated from each other. The polarization beam splitter 18 is disposed in the vicinity of the pupil in the alignment optical system. The functions of the parallel plane plates 16a and 16b will be described later.

The polarizing directions of the two separated luminous fluxes running in parallel to each other are rotated by 45° by a half-wave plate 19. After the two luminous fluxes have passed through a polarization beam splitter 20, the p-polarized light component of each of the luminous fluxes passes in the transmitting direction, and the s-polarized light component of the same passes in the reflecting direction.

The two luminous fluxes which have passed through the polarization beam splitter 20 are converged onto a reference diffraction grating 22 by a lens 21 so that interference fringe moving in the direction of the pitch are formed. Diffracted light which has passed through the diffraction grating 22 is photo-electrically detected by a detector 23 as a reference optical beat signal.

The two luminous fluxes which have been reflected by the polarization beam splitter 20 reach a beam splitter 26 disposed in the vicinity of the pupil of the alignment optical system via relay system 24a, 24b and 25. The two luminous fluxes running parallel to each other and which have passed through the beam splitter 26 pass through a parallel plane plate 35 whose inclination angle can be varied with respect to the optical axis of the alignment optical system for the purpose of maintaining a telecentric relationship. Then, the two luminous fluxes illuminate the diffraction grating mark RM on the reticle 1 in two directions which make a predetermined intersection angle via objective lens 36 and a dichroic mirror 37. The parallel plane plate 35 provided for the purpose of maintaining the telecentric relationship is disposed in the pupil space of the alignment optical system, preferably disposed in the vicinity of the position of the pupil.

The parallel plane plate 35 may be structured by combining a parallel plane plate having a large thickness for the purpose of conducting a coarse adjustment and a parallel plane plate having a small thickness for the purpose of conducting fine adjustment.

In the case where the projecting lens 3 does not have chromatic aberration with respect to alignment light, it is preferable that the objective lens 36 be composed by a bi-focal point optical system disclosed by one of the inventors of the present invention in Japanese Patent Laid-Open No. 63-283129 (U.S. Ser. No. 192,784 filed on May 10, 1988), which was abandoned in favor of continuation application Ser. No. 469,713 filed Jan. 24, 1990, which was abandoned in favor of continuation application Ser. No. 536,939 filed June 12, 1990, which is now U.S. Pat. No. 5,004,348 issued Apr. 2, 1991. In this case, in order to divide the two polarized luminous fluxes made incident upon the bi-focal point optical system, the structure is arranged in such a manner that the polarization direction of the incident fluxes inclines with respect to the optical axis of the bi-focal point optical system. As a result, the luminous fluxes passing toward the first focal point are imaged on the reticle, while the other luminous fluxes passing toward the second focal point are imaged at a position which is outside the reticle, and they are imaged on the wafer via the projecting lens 3.

Figure 2B:
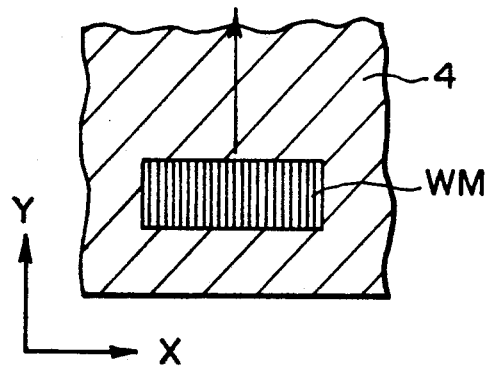
FIG. 2B is a plan view which illustrates a diffraction grating mark WM on a wafer.

As shown in FIG. 2A, the reticle 1 has an opening P0 through which aligning light passes through, the opening P0 formed in parallel to the diffraction grating mark RM. As shown in FIG. 2B, a diffraction mark WM having the same pitch as that of the diffraction grating mark formed on the reticle is formed on the wafer at a position corresponding to the above-described opening P0. As a result, a portion of alignment light illuminates the diffraction grating mark RM on the reticle from two directions making a predetermined intersection angle. As a result, interference fringes are generated moving in the direction of the pitch of the diffraction grating. The intersection angle of the two luminous fluxes has been predetermined so as to make ±1-order diffraction reflected light generated from the diffraction grating mark RM pass in the direction of the optical axis.

As a result, the ±1-order diffraction reflected light generated from the diffraction grating mark RM again passes through the dichroic mirror 37 and the objective lens 36, and then it reaches a field stop 32 via the parallel plane plate 35, the beam splitter 26, the lens 27 and the beam splitter 28.

Figure 2C:
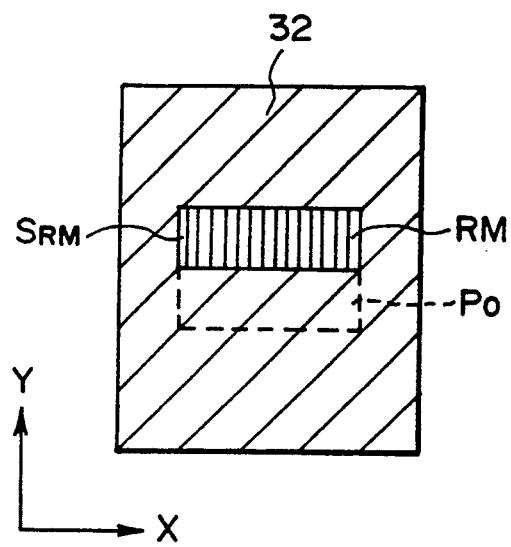
FIGS. 2C and 2D are plan views which respectively illustrate a field stop.

The field stop 32 is positioned in conjugation with the position of the reticle 1. As shown in FIG. 2C, an opening portion $S_{RM}$ is formed at a position corresponding to the diffraction grating mark RM in order to pass only diffracted light from the diffraction grating mark RM on the reticle 1. The diffracted light from the diffraction grating mark RM is subjected to a filtering by a spatial filter 33 for cutting 0-order light (positive reflected light) after it has passed through the field stop 32 so that an optical beat signal including positional information of the reticle 1 is photo-electrically detected by a detector 34.

On the other hand, a portion of the aligning luminous flux which has passed through the opening P0 formed in the reticle illuminates the diffraction grating mark WM on the wafer in two directions making a predetermined intersection angle via the projecting lens 3. As a result, ±1-order diffracted light generated at the mark WM and passing along the optical axis reaches a field stop 29 via the projecting lens 3, the dichroic mirror 37, the objective lens 36, the parallel plane plate 35, the beam splitter 26, the lens 27 and the beam splitter 28.

Figure 2D:
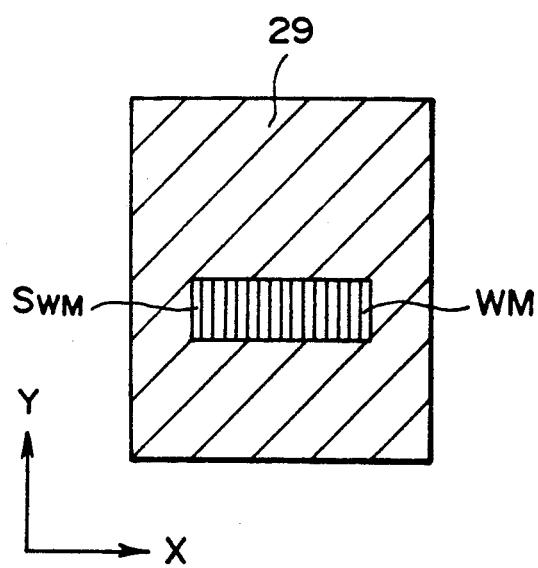

The field stop 29 is positioned in conjugation with the position of the wafer 4. As shown in FIG. 2D, an opening portion $S_{WM}$ is formed at a position corresponding to the diffraction grating mark WM in order to pass only diffracted light from the diffraction grating mark WM on the wafer 4. The diffracted light from the diffraction grating mark WM is subjected to a filtering by a spatial filter 30 for cutting 0-order light (positive reflected light) after it has passed through the field stop 29 so that an optical beat signal including positional information of the wafer 4 is photo-electrically detected by a detector 31.

The spatial filters 30 and 33 are positioned in substantial conjugation with the pupil surface of the alignment optical system, that is, positioned in substantial conjugation with the pupil (the exit pupil) of the projecting lens 3 so that 0-order light (positive reflected light) from the diffraction grating marks formed on the reticle and the wafer is stopped and only ±1-order diffracted light (diffracted light generated in the perpendicular direction with respect to the diffraction gratings of the reticle 1 and the wafer 4) is allowed to pass through. The detectors 31 and 34 are respectively positioned in substantial conjugation with the reticle 1 and the wafer 4 via the objective lens 36 and the lens 27.

When the reticle and the wafer are stopped at optional positions in a state where the position has not been aligned yet, all of the three photoelectric signals obtained from the detectors 23, 31 and 34 become sine wave optical beat signals each having a frequency of Δf, the three photoelectric signals being deviated from one another by a predetermined phase difference. The phase difference (±180°) among the optical beat signals from the reticle 1 and the wafer 4 corresponds to the relative positional deviation which is within half of the grating pitch of the diffraction gratings formed on the reticle 1 and the wafer 4.

When the reticle and the wafer have been moved relatively to each other in the direction in which the gratings are arranged, optical beat signals of the same phase are generated whenever the relative positional deviation becomes half of the grating pitch of the diffraction grating marks RM and WM. Therefore, prealignment with an accuracy better than ½ grating pitch or less of the diffraction grating marks RM and WM can be conducted. A main control system 51 two-dimensionally moves the reticle stage 2 or the wafer stage 5 by using its servo system 52 in such a manner that the phase difference obtained by a phase difference detection system 50 becomes zero. As a result, high resolution position detection can be achieved.

Another arrangement may be employed in which the reference optical beat signal obtained by the detector 23 is arranged to be a reference signal and the position alignment is conducted in such a manner that the phase differences among the above-described reference signal, and the optical beat signals from the diffraction grating marks RM and WM become zero. Furthermore, drive signals for driving the AOMs 15a and 15b may, of course, be used as reference signals.

Now, this embodiment arranged in such a manner that the optical beat signal, which has been photoelectrically detected, does not include any error will be described.

Figure 3:
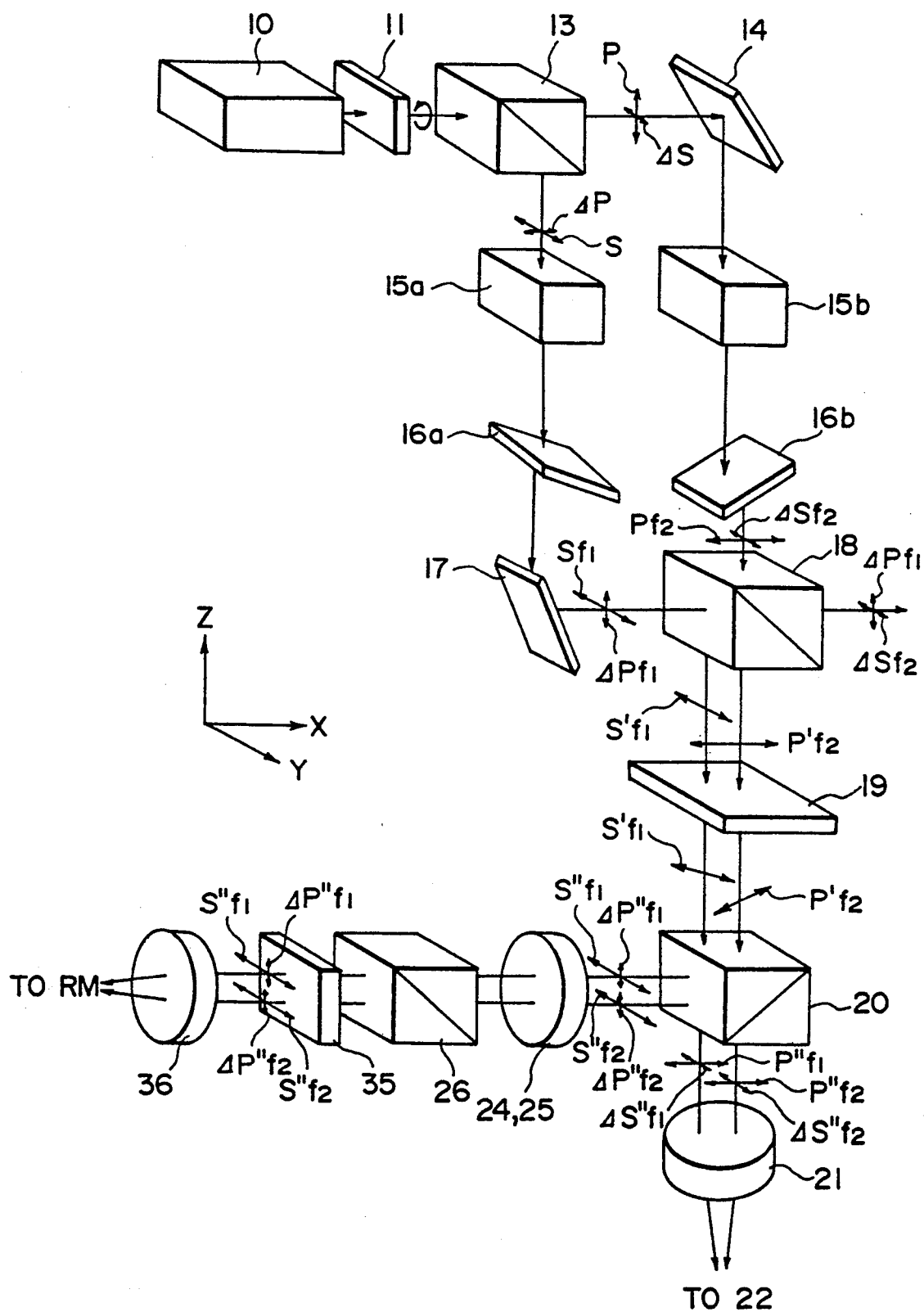
FIG. 3 is a perspective view which illustrates the alignment optical system shown in FIG. 1.

As shown in FIG. 3, the luminous flux supplied from the alignment light source 10 becomes circularly polarized light by the quarter wavelength plate 11 and is separated into s-polarized light and p-polarized light when it passes through the polarization beam splitter 13. Assuming that noise components Δp and Δs polarized perpendicularly to the polarization direction of the s-polarized light and the p-polarized light are included in the s-polarized light and the p-polarized light by small quantities, each of the polarization components of the two luminous fluxes which have respectively passed through the AOMs 15a and 15b is subjected to the same frequency modulation. Then, the two luminous fluxes $S_{f1} + \Delta p_{f1}$ and $P_{f2} + \Delta s_{f2}$ pass through the parallel plane plates 16a and reflecting mirror 17, pass through parallel plane plate 16B, respectively, and reach the polarization beam splitter 18. The polarization beam splitter 18 guides each of the main polarized beam components in predetermined directions and guides the major portion of the noise components $\Delta p_{f1}$ and $\Delta s_{f2}$ in another direction. Therefore, the two luminous fluxes which have passed through the polarization beam splitter 18 are brought to a state in which only a substantially pure main polarized beam component exists.

The polarization direction of each of luminous fluxes $S_{f1}'$ and $P_{f2}'$ which have passed through the polarization beam splitter 18 is rotated by 45° about the optical axis after they have passed through the half-wave plate 19 so as to reach the polarization beam splitter 20 in such a manner that the main polarization directions cross at right angles. The polarization beam splitter 20 strictly splits the main polarized beam component $S_{f1}'$ having the frequency $f_1$ into $P_{f1}''$ and $S_{f1}''$ in corresponding directions x and y. Furthermore, $\Delta s_{f1}''$ and $\Delta p_{f1}''$ exist in a mixed manner as noise components each having a frequency $f_1$ in a direction perpendicular to that of the split luminous fluxes. On the other hand, the main polarized beam component $S_{f2}'$ having the frequency $f_2$ is split into $P_{f2}''$ and $P_{f2}''$ in corresponding directions x and y. Furthermore, $\Delta s_{f2}''$ and $\Delta p_{f2}''$ exist in a mixed manner as noise components each having a frequency $f_2$ in a direction perpendicular to that of the split luminous fluxes.

As, described above, the noise components $\Delta P_{f2}''$ and $\Delta S_{f2}''$ exist in a mixed manner in the two luminous fluxes $P_{f1}''$ and $P_{f2}''$ which have passed through the polarization beam splitter 20. However, each of the noise components $\Delta S_{f1}''$ and $\Delta S_{f2}''$ has the same frequency as that of the corresponding main polarized beam components $P_{f1}''$ and $P_{f2}''$. Therefore, optical beats cannot take place in each of the luminous fluxes and such optical beat signals are not photo-electrically detected as the reference signals via the lens 21, the reference diffraction grating 22 and the detector 23.

The reference optical beat signal obtained by the reference detector 23 does not substantially include an error signal which degrades the accuracy. Thus, a reliable and stable photo-electric signal can be obtained.

On the other hand, the two luminous fluxes $S_{f1}''$ and $S_{f2}''$ reflected by the polarization beam splitter 20 including the noise components $\Delta p_{f1}''$ and $\Delta p_{f2}''$ in a mixed manner illuminate the diffraction grating mark WM on the wafer from two directions via the relay systems 24 and 25, the beam splitter 26, the parallel plane plate 35 and the objective lens 36.

However, since the noise components $\Delta P_{f1}''$ and $\Delta P_{f2}''$ in the luminous fluxes have, similarly to the reference signals, the same frequencies as those of the corresponding main polarized beam components $S_{f1}''$ and $S_{f2}''$, no beat is generated in each of the luminous fluxes. Therefore, each of the photoelectrically detected signals becomes a reliable and stable signal including only the positional information of the reticle and the wafer.

As described above, the luminous fluxes which have been individually frequency-modulated by the AOMs or the like are guided in such a manner that they run symmetrically to each other with the optical axis of the alignment optical system disposed therebetween, without any intersection taking place again, so that the diffraction grating marks RM and WM are illuminated from two direction by the luminous fluxes. Therefore, no light having different frequency which causes a detection error is included in the luminous fluxes, providing a significant improvement.

It might be considered feasible for not only a main polarized beam component but also a noise component to become elliptically-polarized light by the optical members disposed in the alignment optical system according to the present invention. However, the noise component existing by a slight quantity in each of the luminous fluxes according to this embodiment shown in FIG. 3 has the same frequency as that of the main polarized beam component. Therefore, even if noise component $Ny(f_1)$, for example having the same frequency $f_1$ and in the same direction as the main polarized component $Pry(f_1)$ having the frequency $f_1$ exists as shown in FIG. 4, the two luminous fluxes do not beat prior to being applied to the diffraction grating marks RM and WM formed on the reticle and the wafer. Therefore, reliable and stable optical beat signals can be obtained.

Now, the optical path adjustment function of the parallel plane plates 16a and 16b will be described.

The parallel plane plates 16a and 16b act to maintain the state in which the luminous fluxes are split from each other in order to make the light transmission system include no error signal. Furthermore, they shift the optical paths, through which the polarized light passes, in accordance with their inclinations. Therefore, the two optical paths can be arranged in such a manner that they are made to run parallel to each other and separated with the optical axis of the alignment optical system, behind the parallel plane plate disposed therebetween.

The pupil surface Pu of the alignment optical system as shown in FIG. 5 is positioned at the positions at which the polarization beam splitters 18 and 20 are positioned. Beam spots $BS_1$ and $BS_2$ formed by the two luminous fluxes supplied from the light transmission system are formed on the pupil surface Pu with the optical axis positioned therebetween. A pair of parallel plane plates 16a and 16b disposed above the pupil are, as shown in FIG. 5, arranged to be rotatable about x and y-axes. The beam spots $BS_1$ and $BS_2$ formed on the pupil surface Pu move in y-direction when the parallel plane plates 16a and 16b incline with respect to x-axis, while the same move in x-direction when they incline with respect to y-axis. Therefore, the angle of intersection of the two luminous fluxes illuminating the diffraction grating marks WM and RM formed on the wafer or the reticle can be adjusted.

An angle $\theta$ of intersection of the two luminous fluxes for illuminating the diffraction grating marks WM and RM is the sum of the incident angles $(\alpha, \beta)$ of the two luminous fluxes. Therefore, assuming that the wavelength of the laser light source is $\lambda$, the pitch of the diffraction grating is P, the order of the diffracted light generated due to the luminous flux for illuminating the diffraction grating at an incident angle $\alpha$ is $n_1$ ($n_1 > 0$)

and the order of the diffracted light generated due to the luminous flux for illuminating the diffraction grating at an incident angle $\beta$ is $n_2$ ($n_2<0$), the intersection angle $\theta$ can be defined as follows:

$$\theta=\sin^{-1}(n_1 \lambda/P)-\sin^{-1}(n_2 \lambda/P) \quad (9)$$

Therefore, the beam spots $BS_1$ and $BS_2$ on the pupil surface Pu can be adjusted in x-direction by inclining the parallel plane plates 16a and 16b about y-axis in accordance with the predetermined intersection angle $\theta$. Therefore, a proper intersection angle in accordance with the pitches of the diffraction grating marks WM and RM can be obtained merely by changing the inclination angle of the parallel plane plates.

Figure 6A:
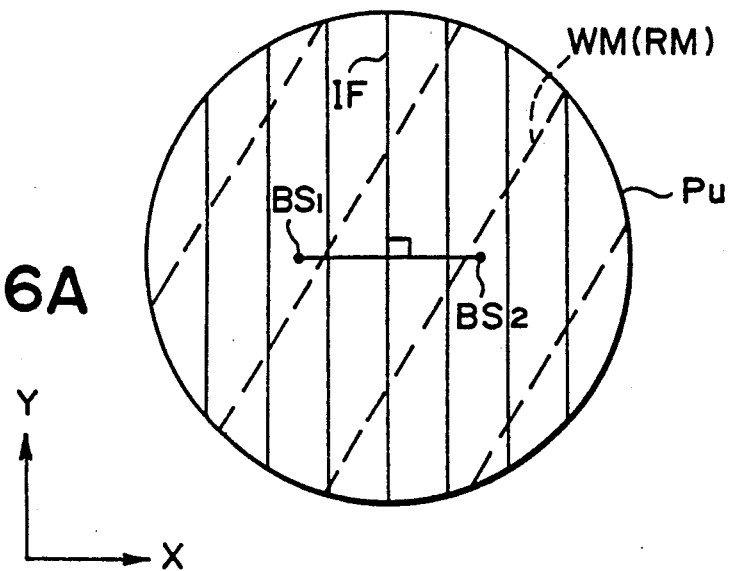
FIG. 6A illustrates a state in which the interference fringe and the diffraction grating mark deviate considerably from each other.

However, even if the intersection angle $\theta$ has been adjusted, an optical beat signal of a high contrast and including accurate positional information cannot be obtained in the case where the direction (generation direction) of the arrangement of interference fringes IF designated by a continuous line of FIG. 6A and the direction (the direction of the pitch) of the arrangement of the diffraction grating marks WM and RM designated by a short dashed line deviate from each other in the plane of pupil surface Pu. Therefore, the direction of the arrangement of the interference fringes IF must be further adjusted by moving the positions of the beam spots $BS_1$ and $BS_2$ formed on the pupil surface Pu.

Figure 6B:
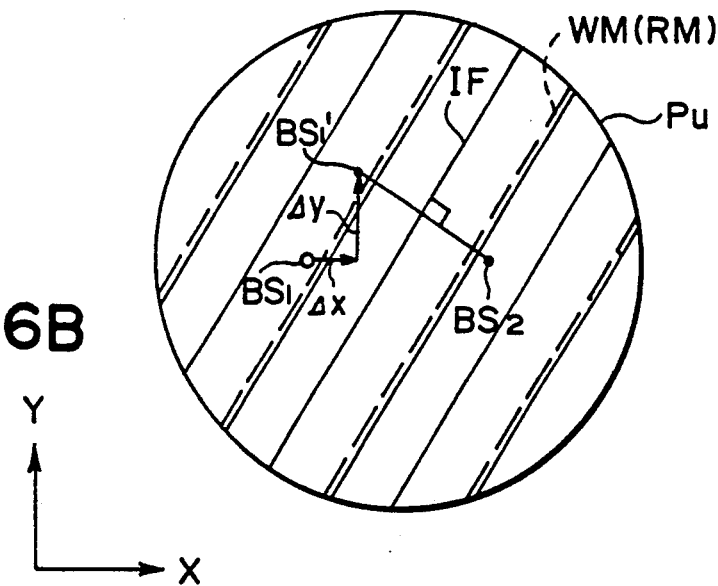
FIG. 6B illustrates a state in which the direction of the interference fringe and that of the diffraction grating mark are compensated and made to coincide with each other.

The moving interference fringes IF formed on the marks WM and RM are arranged perpendicularly to a straight line connecting the two beam spots $BS_1$ and $BS_2$ on the pupil surface Pu. Therefore, in order to make the direction perpendicular to the straight line connecting the two beam spots $BS_1$ and $BS_2$ to be the arrangement direction of the gratings of the diffraction grating marks WM and RM with the predetermined intersection angle maintained, it is necessary for the parallel plane plate 16a to be inclined about x and y-axes respectively. Thus, as shown in FIG. 6B, the beam spot $BS_1$ is moved in x-direction by $\Delta X$ and in y-direction by $\Delta Y$ so as to be positionally compensated to the position $BS_1'$.

Figure 6C:
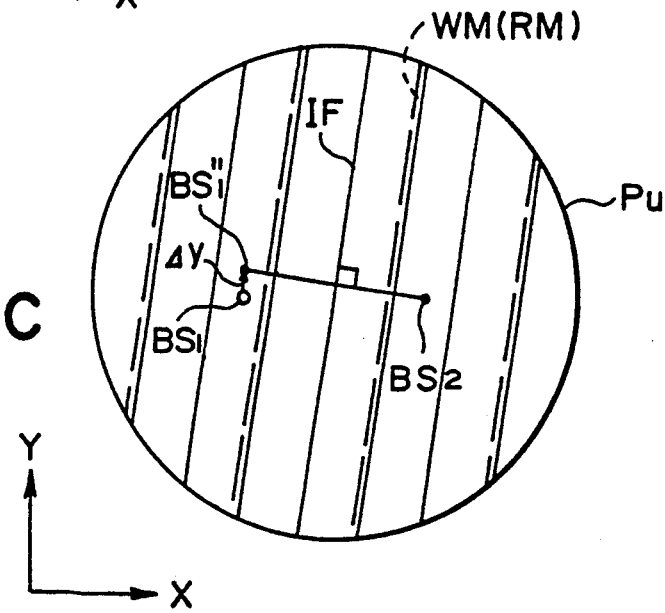
FIG. 6C illustrates a state in which the interference fringe and the diffraction grating mark, which had been deviated from each other by a slight degree, have been compensated.

In the case where the direction of the arrangement of the interference fringes IF and the directions of the arrangement of the marks WM and RM are slightly deviated from each other, the parallel plane plate 16a is only required to be one-dimensionally inclined about x-axis so as to move the beam spot $BS_1$ in y-direction by $\Delta Y$ and compensate the position to $BS_1''$ as shown in FIG. 6C.

As described above, the direction of arrangement of the interference fringes IF and the direction of arrangement of the marks WM and RM can be maded to coincide with each other with a predetermined intersection angle maintained by two-dimensionally inclining at least one of the parallel plane plates.

In order to automatically achieve the above-described coincidence, it is preferable that the inclinations of the parallel plane plates 16a and 16b for coinciding the intersection angle and the inclinations of the parallel plane plates 16a and 16b for coinciding the direction of arrangement of the interference fringe and the direction of the arrangement of the diffraction grating mark with each other be feed-back controlled.

Specifically, when, for example, the intersection angle is adjusted, the inclination of each of the parallel plane plates must be controlled as described above so as to make the contrast of the optical beat signals, which are photo-electrically detected, the maximum level. When the direction of the arrangement of the interference fringe and the direction of the arrangement of the marks are adjusted, the inclination of each of the parallel plane plates are necessary to be controlled as described above so as to make the contrast of the optical beat signals. which are photo-electrically detected, the maximum level. As a result, the deviation between them can be compensated.

As described above, according to this embodiment, parallel plane plates whose inclinations can be varied two-dimensionally are disposed in the alignment optical system so as to adjust the optical paths. A parallel plane plate may be disposed in at least one of the optical paths. Another structure may be employed in which a plurality of parallel plane plates whose inclinations can be varied one-dimensionally are disposed in the alignment optical system in each of the optical paths.

Referring to FIGS. 6B and 6C, although the two beam spots are positioned away from the optical axis by a short distance, the optical beat signals to be detected are not influenced from this.

In order to compensate the deviation between the direction of the arrangement of the interference fringes and the direction of the arrangement of the marks WM and RM, an image rotator may be disposed in the alignment optical system.

Now, a modification to this embodiment will be described.

Referring to FIG. 1, the polarization beam splitter 18 is replaced by a prism having a light-transmitting plane and a light-reflecting plane and a half-wave plate 60 is disposed between the parallel plane plate 16b and the prism. Luminous flux emitted from the laser light source 10 and split into two portions by the polarization beam splitter 13 is modulated by AOMs 15a and 15b so as to have different frequencies. S-polarized light modulated by the AOM 15a to have the frequency $f_1$ is reflected by the reflecting plane of the prism 18 via the reflecting mirror 17. On the other hand, p-polarized light which has been modulated by the AOM 15b so as to have the frequency $f_2$ is made s-polarized light by the half-wave plate 60 and is thereby transmitted by the transmitting plane of the prism 18.

Each of s-polarized light beams having different frequencies which has been reflected and transmitted by the prism 18 is transmitted by the half-wave plate 19. Since the polarization directions of the luminous fluxes have been aligned to each other, the light quantity of the luminous fluxes supplied, by the polarization beam splitter 20, to the reference signal detection system and to the light transmitting system for illuminating the reticle and the wafer can be adjusted. The light quantity necessary as reference light for photo-electrical detecting performed in the detector 23 can be reduced. Therefore, luminous flux having a large light quantity can be supplied to the diffraction grating marks RM and WM by adjusting the degree of rotation of the half-wave plate 19.

Another structure may be employed in which the polarization beam splitter 13 is replaced by a beam splitter and the partial reflecting plane of the prism 18 is formed by a metal film. In this case, the half-wave plate 60 can be omitted from the structure since the polarized planes of the luminous fluxes made incident upon the prism 18 have been aligned. Since the luminous flux emitted from the laser source 10 is divided into two portions by the beam splitter so as to be subjected to the independent frequency-modulation by the AOMs 15a and 15b, the optical beat signal which is to be photoelectrically detected is not degraded even if polarization components having the same frequency are mixed in each of the luminous fluxes having the different frequencies. That is, since the state in which the luminous fluxes are separated without the luminous flux components having different frequencies is maintained, the luminous flux can illuminate the diffraction grating marks RM and WM from two directions without any beats.

Now, a second embodiment of the present invention will be described.

Figure 8:
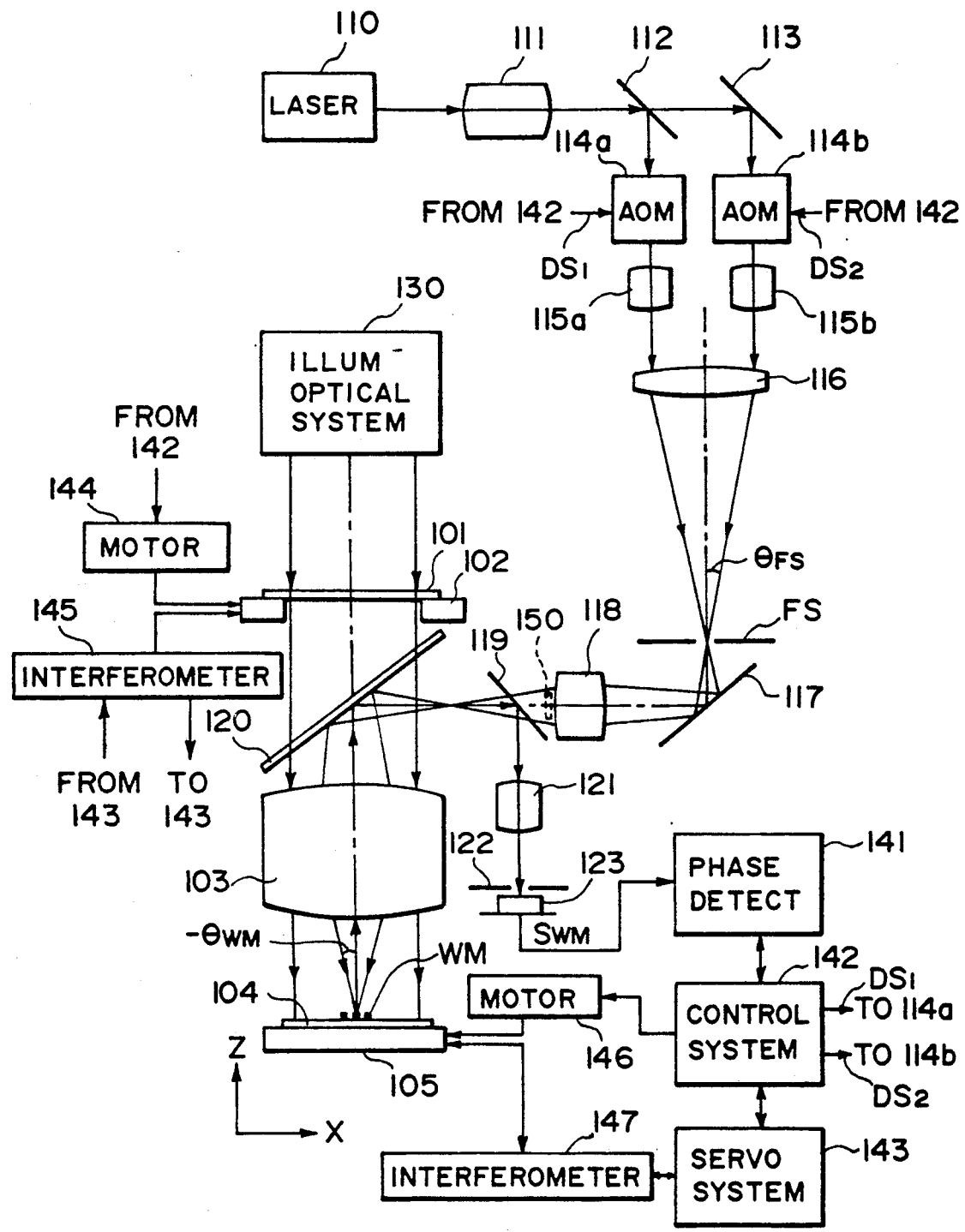
FIG. 8 illustrates the schematic structure of a second embodiment of a projection exposing apparatus according to the present invention.

Referring to FIG. 8, a reticle 101 having a predetermined circuit pattern thereon is held by a reticle stage 102 which can move two-dimensionally. The pattern formed on the reticle 101 is uniformly illuminated with exposing light supplied from an illuminating optical system 130 so as to be imaged on the wafer 104 via a projecting lens 103. A wafer mark WM of the alignment diffraction gratings is formed on the wafer 104. The wafer 104 is held by a stage 105 which can move two-dimensionally.

In order to independently detect the x directional, y directional and rotational ($\theta$) positions on the reticle stage 102 and the wafer stage 105, interferometers 145 and 147 are provided. The stages are moved in each of the directions by motors 144 and 146.

Laser beams emitted from a laser light source 110 are expanded by a beam expander 111 to a predetermined beam diameter and are divided into two portions by a beam splitter 112. The luminous flux reflected by the beam splitter 112 is made incident upon an acoustooptical modulator 114a (AOM). On the other hand, luminous flux transmitted by the beam splitter 112 is made incident upon an AOM 114b via a reflecting mirror 113. When each of the luminous fluxes is subjected to the frequency modulation by the corresponding AOMs 114a and 114b, they become luminous fluxes having different frequencies. They are relayed by lenses 115a, 115b and 116 so that luminous fluxes illuminate the field stop FS from two directions at predetermined incident angles ($\pm\theta_{FS}$).

As a result of the application of the alignment light, interference fringes moving on the field stop FS are formed. Assuming that the wavelength of the alignment light is $\lambda$, the pitch of the interference fringes becomes:

$$P_{FS} = \frac{\lambda}{2\sin\theta_{FS}}$$

Assuming that the luminous flux which has passed through the AOM 114a is frequency-modulated into the frequency $f_1$ and the luminous flux which has passed through the AOM 114b is frequency-modulated into the frequency $f_2$, the interference fringes move at a speed of $P_{FS} \times |f_1 - f_2|$.

The alignment light beams which have passed through the field stop FS cause two coherent light beams having different frequencies from each other to be applied to the diffraction grating mark WM formed on the wafer at incident angles ($\pm\theta_{WM}$) which become symmetric with respect to the normal direction (in the direction of the optical axis) via a reflecting mirror 117, an objective lens 118, a beam splitter 119, a dichroic mirror 120 and a projecting lens 103. As a result, interference fringes moving on the wafer mark are formed similarly to those on the above-described field stop FS. The pitch $P_{IWM}$ of the interference fringes becomes:

$$P_{IW} = \frac{1}{2\sin\theta_{WM}}$$

The interference fringes move at a speed of $P_{IWM} \times |f_1 - f_2|$.

At this time, $\pm$n-order diffracted light is generated in the normal direction of the wafer mark WM. The above-described incident angle $\theta_{WM}$ can be given assuming that the pitch of the diffraction grating mark WM is $P_{WM}$ and the wavelength of the alignment light is $\lambda$:

$$\sin\theta_{WM} = \pm n \frac{\lambda}{P_{WM}}.$$

The $\pm 1$-order diffracted light generated in the normal direction is photo-electrically detected by a detector 123 via the projecting lens 103, the dichroic mirror 120, the beam splitter 119, the objective lens 121 and the spatial filter 122, the detector being positioned in conjugation with the pupil of the projecting lens 103.

The spatial filter 122 is positioned in conjugation with the pupil of the projecting lens 103 and acts to pass diffracted light from the wafer mark WM passing in the direction of the optical axis.

A phase detection system 141 detects the phase difference between optical beat signal $S_{WM}$ obtained by the detector 123 and the drive signal difference $|DS_1 - DS_2|$ between the drive signals for the AOM 114a and 114b. In accordance with the phase difference, a control system 142 controls the wafer stage 105 in such a manner that the phase difference becomes zero. Thus, the position alignment of the wafer, that is, the alignment is conducted.

The above-described field stop FS restricts the illumination region on the wafer diffraction grating mark and shields the detector from the incidence of a portion of the alignment light which has been reflected or scattered by the wafer. However, if diffracted light is generated at the edge of the field stop FS, the detection accuracy is degraded, as will be described now.

Figure 9:
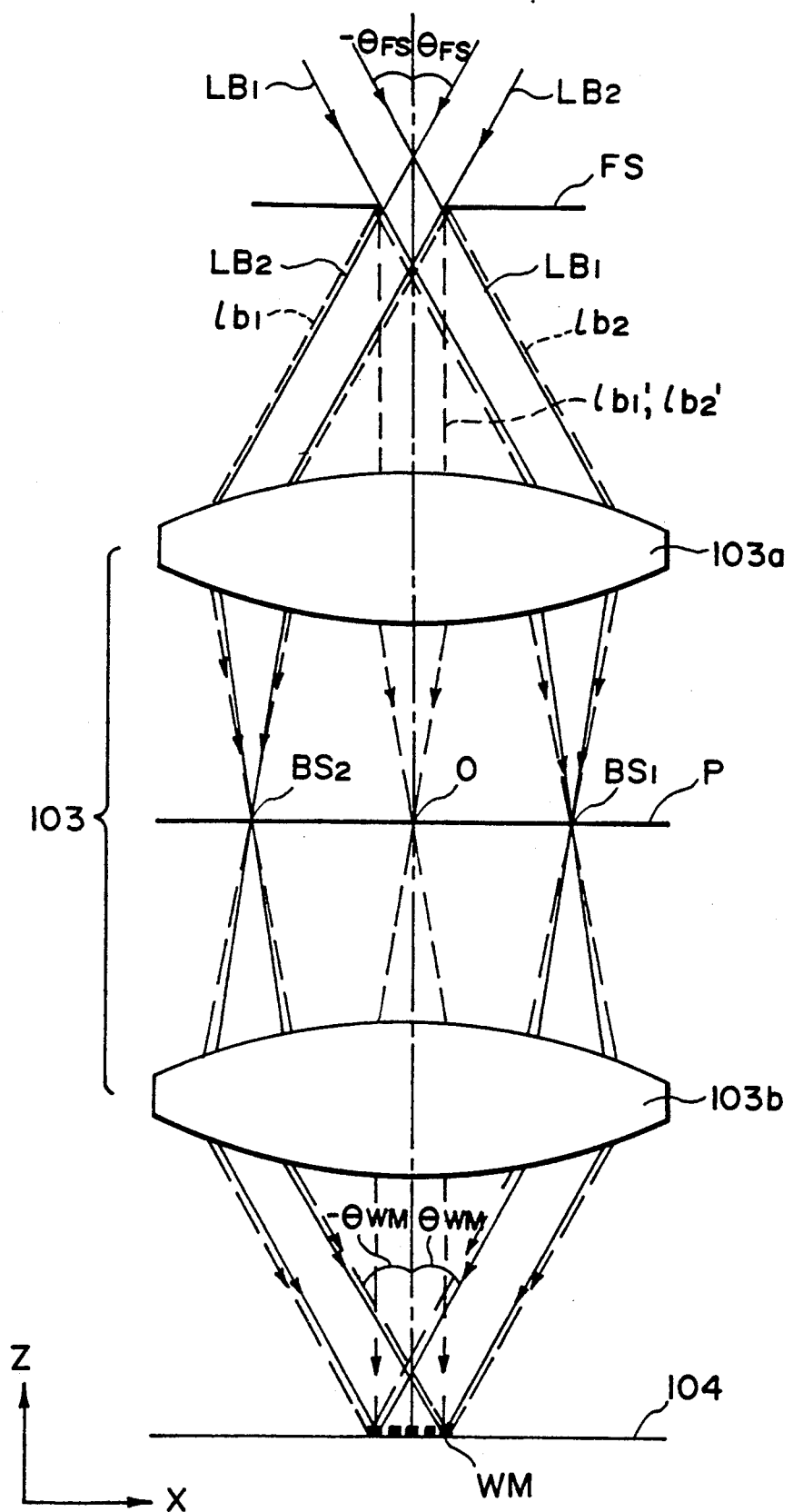
FIG. 9 illustrates the optical path of the alignment optical system shown in FIG. 8.

As designated by continuous line shown in FIG. 9, coherent alignment light beams LB$_1$ and LB$_2$ having different frequencies from each other illuminate the field stop FS from two directions at predetermined incident angle $\theta_{FS}$. After the light beams LB$_1$ and LB$_2$ have passed through the lens 103a forming a portion of the projecting lens 103, two beam spots BS$_1$ and BS$_2$ are formed on the pupil surface P (a Fourier plane) of the projecting lens. The alignment light which has passed through the lens 103b forming a portion of the projecting lens 103 illuminates the illumination region of the diffraction grating mark WM formed on the wafer from two directions at predetermined incident angles ($\pm\theta_{WM}$).

The incident angle ($\pm\theta_{WM}$) is arranged so as to generate $\pm 1$-order diffracted light in the normal direction (in the direction of the optical axis) of the wafer mark WM. Therefore, in order to conduct the ideal alignment, only $\pm 1$-order diffracted light LB$_1$ (+1) and LB$_2$ (−1) generated in the normal direction by the wafer mark WM must be detected. However, when the field stop FS is illuminated with alignment light beams LB$_1$ and LB$_2$ having different frequencies from each other and having predetermined intersection angles ($\pm\theta_{FS}$) from two directions, diffracted light is generated from the field stop FS. The diffracted light degrading the alignment accuracy is analyzed as follows:

Since the two alignment light beams $LB_1$ and $LB_2$ made incident upon the field stop FS can be treated as plane waves, Franformer analysis can be conducted on the pupil surface P of the projecting lens. Quantitatively, diffraction intensity distribution $DF_1$ due to the alignment light $LB_1$ and the diffraction intensity distribution $DF_2$ due to the alignment light $LB_2$ are formed symmetrically with respect to the pupil center O on the pupil surface P (on the Fourier plane) as shown in FIG. 10. Therefore, diffracted light of the alignment light $LB_2$ having intensity $I_N$ is mixed into the alignment light $LB_1$ having intensity $I_O$ forming the beam spot at the position $BS_1$. Diffracted light of the alignment light $LB_1$ having intensity $I_N$ is mixed into the alignment light $LB_2$ having intensity $I_O$ forming the beam spot at the position $BS_2$.

Therefore, as designated by dashed line of FIG. 9, noise diffracted light $1b_1$ generated due to the alignment light $LB_1$ having the frequency $f_1$ passes through the same optical path for the alignment light $LB_2$ having the frequency $f_2$. The alignment light $LB_2$ and the noise light $1b_1$ beat and illuminate the wafer mark WM at an incident angel of $-\theta_{WM}$.

On the other hand, noise diffracted light $1b_2$ generated due to the alignment light $LB_2$ having the frequency $f_2$ also passes through the same optical path for the alignment light $LB_1$ having the frequency $f_1$. The alignment light $LB_1$ and the noise light $1b_2$ beat and illuminate the wafer mark WM at an incident angel of $+\theta_{WM}$.

FIG. 11 illustrates a state in which diffracted light is generated on the wafer mark WM. As shown in FIG. 11, $-1$-order diffracted light $LB_2(-1)$ of the alignment light $LB_2$ and $-1$-order- diffracted light $1b_1(-1)$ of the noise diffracted light $1b_1$ are generated in the normal direction of the mark WM, and $+1$-order diffracted light $LB_1(+1)$ and $+1$-order diffracted light $1b_2(+1)$ of noise diffracted light $1b_2$ are generated.

As is shown from FIG. 10, the diffracted light of each of the alignment light beams has been mixed into center O of the pupil surface of the projecting lens. Therefore, in the state shown in FIG. 9, the noise diffracted light $1b_1'$ and $1b_2'$ of each of the alignment light due to the field stop FS passes on the optical axis and beats with each other so that the wafer mark WM is vertically illuminated. As a result, 0-order diffracted light $1b_1'(0)'$ and $1b_2'(0)'$ are generated in the normal direction of the wafer mark WM.

As described above, the detector positioned in conjugation with the pupil surface P of the projecting lens detects all of light beams generated in the normal direction of the wafer mark. Therefore, if noise diffracted light is included in the detected light, the optical beat signal detected includes an excessive detection error.

The physical phenomenon will now be further analyzed.

Assuming that the amplitude of the $+1$-order diffracted light $LB_1(+1)$ generated in the normal direction of the wafer mark WM due to the alignment light $LB_1$ is $A_1$, the amplitude of the $-1$-order diffracted light $LB_2(-1)$ generated in the normal direction of the wafer mark WM due to the alignment light $LB_2$ is $A_2$, the amplitude of $-1$-order diffracted light $1b_1(-1)$ generated in the normal direction of the wafer mark WM due to the noise light diffracted light $1b_1$ passing through the same optical path for the alignment light $LB_2$ is $b_1$, and the amplitude of $+1$-order diffracted light $1b_2(+1)$ generated in the normal direction of the wafer mark WM due to the noise light diffracted light $1b_2$ passing through the same optical path for the alignment light $LB_1$ is $b_2$, the optical beat signal $S_{WM}$ which is photoelectrically detected by the detector can be expressed by the following equation:

$$S_{WM} = A_1\cos(\omega_1 t + \phi_1) + A_2\cos(\omega_2 t + \phi_2) + b_1\cos(\omega_1 t + \delta_1) + b_2\cos(\omega_2 t + \delta_2) \quad (10)$$

Since the signal detected by the detector is the time average of the intensity (that is, the square of the amplitude), the intensity of the detected signal when $\Delta\omega = \omega_1 - \omega_2$ becomes as follows:

$$\begin{aligned}\langle S^2_{WM}\rangle &= \lim_{T\to\infty}\frac{1}{T}\int_0^T E^2 dt = \\ &(A_1^2 + A_2^2 + b_1^2 + b_2^2)/2 + A_1 A_2\cos(\Delta\omega t + \phi_1 - \phi_2) + \\ &b_1 b_2\cos(\Delta\omega t + \delta_1 - \delta_2) + A_1 b_2\cos(\Delta\omega t + \phi_1 - \delta_2) + \\ &A_2 b_1\cos(\Delta\omega t + \delta_1 - \phi_2) + A_1 b_1\cos(\phi_1 - \delta_1) + \\ &A_2 b_2\cos(\phi_2 - \delta_2)\end{aligned} \quad (11)$$

When, for example, the wafer is displaced by x in X direction letting the pitch of the wafer mark WM be $P_{WM}$, the phase difference corresponding to this becomes:

$$\phi_1 = \delta_2 = \frac{2\pi x}{P_{WM}}$$

$$\phi_2 = \delta_1 = -\frac{2\pi x}{P_{WM}}$$

In order to make the description easier, it is provided that $A_1 = A_2 \equiv A$, $b_1 = b_2 \equiv b$ and that all of phases other than the phase difference due to the above-described movement of the wafer are zero. Equation (11) can now be expressed by the following equation:

$$\langle S^2_{WM}\rangle = (A^2 + b^2) + (A^2 + b^2)\cos\left(\Delta\omega t + \frac{4\pi x}{P_{WM}}\right) + 2Ab\cos(\Delta\omega t) + 2Ab \quad (12)$$

As is shown from Equation (12), the optical beat signal observed by the detector becomes only the second and the third terms on the right side and only the phase of the second term is changed due to the displacement of the wafer in direction X. Furthermore, the third term represents the noise component which has no relationship with the displacement of the wafer in X direction. Therefore, it is apparent that the phase difference between the optical beat signal $S_W$ observed by the detector and the drive signal DS for the AOM can be detected as the difference from the synthesized waveform of the second the third terms on the right side of Equation (12).

Furthermore, the phase change due to the displacement x of the wafer in direction x can be expressed by the following equation:

$$a = \frac{4\pi x}{P_{WM}} \quad (13)$$

Figure 12:
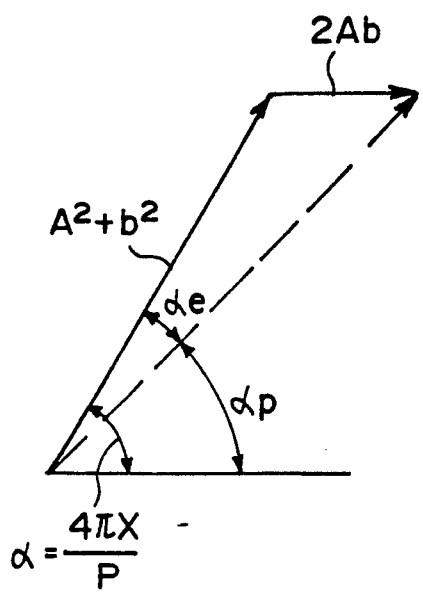
FIG. 12 illustrates the phase error place in the optical beat signal to be detected.

Due to the bad influence of the error factor in the third term of Equation (12), the phase difference which is actually detected becomes $a_p$ as shown in FIG. 12, and the phase error becomes its maximum value when $a = \pi/2$.

In this case, assuming that $A^2 + b^2 >> 2Ab$, the phase error $a_e (= a - a_p)$ can be approximated as $$a_e \simeq \frac{2Ab}{A^2 + b^2} \quad (14)$$

Furthermore, assuming that $A >> b$, Equation (14) can be approximated as:

$$a_e \simeq \frac{2b}{A} \quad (15)$$

As described above, the alignment is conducted in such manner that the relative phase difference between the drive signal $|DS_1 - DS_2|$ of the AOM and the optical beat signal SWM is made to correspond to the displacement of the wafer. Therefore, the phase error acts as a positional error which excessively influences the detection accuracy.

Assuming that the phase error is $a_e$ and the pitch of the wafer mark of the diffraction grating formed and the wafer is $P_{WM}$, the positional error $X_e$ of the wafer becomes as follows since the pitch of the interference fringes formed on the wafer mark is $P_{WM}/2$:

$$X_e = \frac{a_e P_{WM}}{4} \quad (16)$$

For example, assuming that the pitch of the wafer mark WM is 8 μm and the positional error of the wafer is 0.02 μm or less, the following equation can be obtained from Equation (13):

$$a_e = \frac{4\pi X_e}{P_{WM}} = \frac{4\pi \cdot 0.02 \ \mu m}{8 \ \mu m} = 0.0314 (rad) = 1.8°.$$

In this case, the ratio of the noise diffracted light $1b_1$ and $1b_2$ included in each of the alignment light $LB_1$ and $LB_2$ due to the field stop FS must meet the following condition since $b/A = a_e/2$ as expressed in Equation (15):

$$\frac{b}{A} \leq 0.016 \quad (17)$$

Then, the amplitude of the noise diffracted light actually mixed into each of the alignment light on the pupil surface P of the projecting lens is obtained. As described above, since the Franformer analysis can be conducted on the pupil surface P, the sine value of the emission angle of the diffraction light generated from the field stop FS can be arranged to be ξ which is the coordinate on the pupil surface. Therefore, the amplitude distribution of each of the diffracted light on the pupil surface P can be given by the following equation:

$$b = A_0 \frac{\sin[\pi W(\xi \pm \xi_0)/\lambda]}{\pi W(\xi \pm \xi_0)/\lambda} \quad (18)$$

(Wherein a combination of + a. ' − signs between a denominator and a numerator is excluded) where the amplitude of the diffracted light is b, the amplitude of a plane wave incident upon the field stop is A0, the wavelength of the alignment light beams $LB_1$ and $LB_2$ is λ, the width of the field stop is w, the distances from center O of the pupil surface P to the beam spots $BS_1$ and $BS_2$ are $\pm \xi_0$ ($= \sin \pm \theta_{FS} = \pm \lambda/2P_{FS}$), the incident angle of the alignment light beams $LB_1$ and $LB_2$ illuminating the field stop FS are $\pm \theta_{FS}$, the pitch of the interference fringes formed on the field stop is $P_{FS}$ and $\sin 0/0 = 1$.

Figure 13:
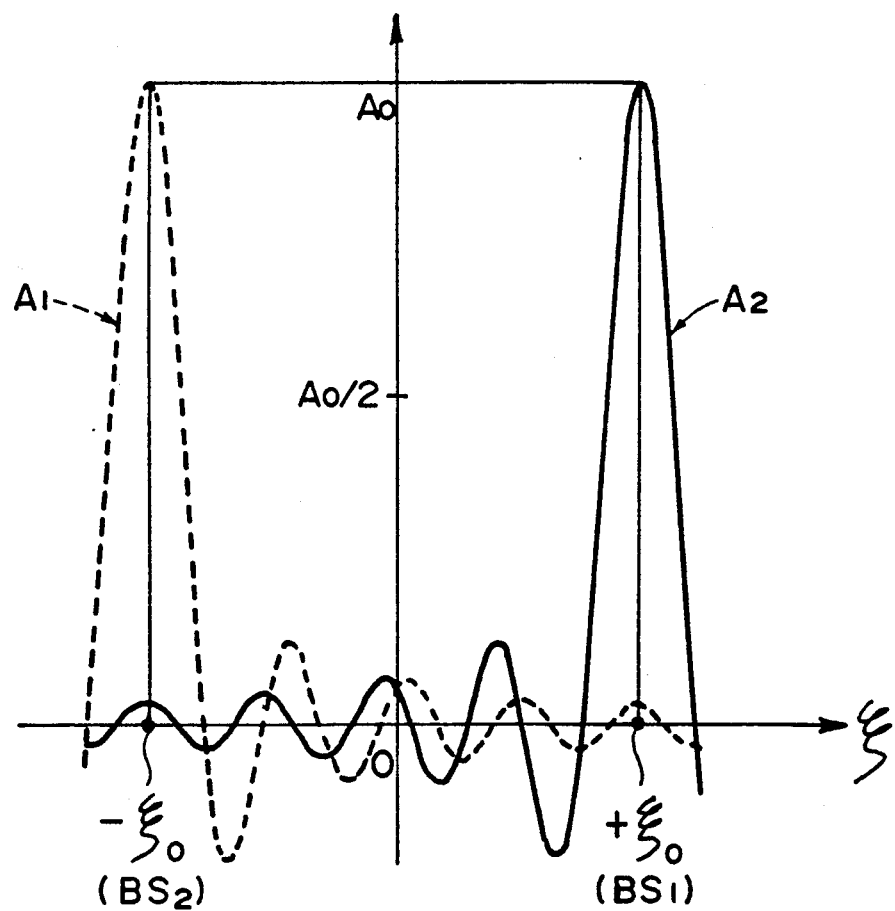
FIG. 13 illustrates the amplitude distribution of diffracted light.

FIG. 13 is a graph of Equation (18) where a curve A1 shows the diffraction amplitude distribution due to the alignment light $LB_2$ on the pupil surface P of the projecting lens and curve A2 show the diffraction amplitude distribution due to the alignment light $LB_2$ on the pupil surface P of the projecting lens. The two curves can be also explained in the case on the pupil surface P of the projecting lens from the diffraction intensity distribution shown in FIG. 10.

For example, when the amplitude b of the noise diffraction light $1b_2$ at the beam spot position $BS_1$ ($\xi = +\xi_0$) of the alignment light $LB_1$ as designated by the curve A1 on the pupil surface P of the projecting lens is obtained, or when the amplitude b of the noise diffraction light $1b_1$ at the beam spot position $BS_2$ ($\xi = -\xi_0$) of the alignment light $LB_2$ as designated by the curve A2, is obtained, Equation (18) becomes as follows:

$$b = A_0 \frac{\sin(\pi W 2\xi_0/\lambda)}{\pi W 2\lambda_0/\lambda} = A_0 \frac{\sin(\pi W/P_{FS})}{\pi W/P_{FS}} \quad (19)$$

For example, when the pitch of the interference fringes formed on the field stop is 4 μm and the shape of the field stop is in the form of a rectangle having a width w = 50 μm, Equation (19) becomes as follows:

$$\frac{b}{A_0} = \frac{\sin(\pi \cdot 50 \ \mu m/4 \ \mu m)}{\pi \cdot 50 \ \mu m/4 \ \mu m} = 0.025.$$

Therefore, the above-described value is larger than $b/A0 \leq 0.016$ obtained in Equation (16). That is, it is difficult to secure an accuracy better than 0.02 μm or less in the structure in which the rectangular field stop FS is employed due to the influence of the diffraction from the field stop FS.

The amplitude b of either the noise light passing through the center O ($\xi = 0$) of the pupil surface P of the projecting lens after it has passed in the direction of the optical axis due to the field stop FS can be obtained from Equation (18) as follows:

$$b = A_0 \frac{\sin(\pi W \xi_0/\lambda)}{\pi W \lambda_0/\lambda} = A_0 \frac{\sin \pi w/2P_{FS}}{\pi w/2P_{FS}}.$$

Assuming that the width w of the field stop and the pitch $P_{FS}$ of the interference fringes formed on the field stop are determined to be the above-described values, the following relationship can be obtained:

$$\frac{b}{A_0} = \frac{\sin(\pi \cdot 50 \ \mu m/8 \ \mu m)}{\pi \cdot 50 \ \mu m/8 \ \mu m} = 0.036.$$

As a result, the value becomes larger than 0.016 obtained by Equation (16). Therefore, an accurate alignment cannot be conducted.

Accordingly, the shape of the edge of the field stop FS is designed as follows in consideration of the direction of the groove of the diffraction grating mark on the wafer.

As shown in FIG. 14, edges e1 and e2 of the field stop FS extend in direction X corresponding to the direction of the arrangement of the wafer mark WM and edges e3 and e4 extend with inclined by $\theta°$ to direction Y (perpendicular to the direction of the arrangement) corresponding to the direction of the groove of the wafer mark WM.

As shown in FIG. 9, coherent light $LB_1$ and $LB_2$ having different frequencies from each other are applied to the field stop FS having a parallelogram shape from two directions at predetermined incident angles ($\pm \theta_{FS}$) in such a manner that the coherent light beams $LB_1$ and $LB_2$ become symmetrical with respect to the optical axis. As a result, the direction of generation of the diffracted light is, as shown in FIG. 15, inclined by $\theta°$ with respect to direction $\xi$ in accordance with inclination $\theta$ of the edge pair e3 and e4. The direction of generation of the diffracted light due to the other edge pair e1 and e2 becomes in direction $\eta$. The $\xi$-$\eta$ coordinate on the pupil surface corresponds to the sine of the angle of emission of the diffracted light in direction XY generated from the field stop FS. Therefore, a diffraction intensity distribution along a direction inclined by $\theta°$ with respect to direction $\xi$ centered about each of the beam spot positions $BS_1$ and $BS_2$ and another diffraction intensity distribution along direction $\eta$ are formed on the pupil surface P of the projecting lens.

The diffraction intensity of the alignment light $LB_1$ forming the beam spot $BS_1$ comprises diffraction intensity distribution $DF_1$ which damps in accordance with the distance from the origin O as shown in FIG. 16, where a two dimensional expansion having external values of the diffraction intensity present at the positions designated by black dots is shown. The pupil center O and the beam spot position $BS_2$ ($-\xi_0$, 0) receive slight degradation from the noise diffracted light which is two-dimensionally distributed.

Therefore, it is necessary for the shape of the opening of the field stop to be capable of reducing the noise light which can reach the light receiving surface of the detector disposed at a position in conjugation with the pupil surface (or a position in conjugation with the wafer). That is, when the alignment light beam $LB_1$ and $LB_2$ are transmitted to the wafer mark WM, the shape of the opening must to be able to reduce the influence of the diffracted light of the field stop FS upon the pupil center or the beam spot positions $BS_1$ and $BS_2$ of the alignment light on the $\xi$-$\eta$ coordinate on the pupil surface P. Then, the inclination q of the edges e3 and e4 is determined as follows:

Analysis of the amplitude distribution on the coordinate $\xi$-$\eta$ on the pupil surface shown in FIG. 16 gives $$b = A \frac{\sin[(\pi W(\xi \pm \xi_0) \cos^2\theta)/\lambda]}{\pi W(\xi \pm \xi_0) \cos^2\theta/\lambda} \times \quad (20)$$

-continued
$$\frac{\sin[(\pi h(\eta - (\xi \pm \xi_0)\tan\theta)/\lambda]}{\pi h(\eta - (\xi \pm \xi_0)\tan\theta)/\lambda}$$

(wherein a combination of + and − signs between a denominator and a numerator excluded) where the length of the longitudinal edge of the field stop FS extending in the direction (X-direction) of the arrangement of the wafer mark WM is W, the length of the lateral edge perpendicular (Y-direction) to the longitudinal edge is h, the inclination of the lateral edge is $\theta$ and sin 0/0=1.

As shown in FIG. 15, the amplitude of the noise light caused of mixture by diffracted light $DF_2$ due to the alignment light $LB_2$ into the alignment light $LB_1$ passing through the beam spot position $BS_1$ at coordinate ($+\xi_0$, 0), or the amplitude of the noise light caused of mixture by diffracted light $DF_1$ due to the alignment light $LB_1$ into the alignment light $LB_2$ passing through the beam spot position $BS_2$ at coordinate ($-\xi_0$, 0) can be obtained from Equation (20) as follows:

$$\begin{aligned} b &= A_0 \frac{\sin[(\pi W \cdot 2\xi_0 \cdot \cos^2\theta)/\lambda]}{(\pi W \cdot 2\xi_0 \cdot \cos^2\theta)/\lambda} \times \\ &\quad \frac{\sin[\pi h(-2\xi_0 \cdot \tan\theta)/\lambda]}{\pi h(-2\xi_0 \cdot \tan\theta)/\lambda} \\ &= A_0 \frac{2P_{FS}^2 \sin[(\pi w \cos^2\theta)/P_{FS}]}{\pi w h \sin 2\theta} \times \\ &\quad \sin[(\pi h \tan\theta)/P_{FS}] \end{aligned} \quad (21)$$

where the sine of angle $\theta_{FS}$ made by light which reaches the center O of the pupil and the light which reaches the beam spot $BS_1$ (or $BS_2$), that is sine $\theta_{FSq}$ is $\xi_0$, the wavelength of the alignment light $LB_1$ and $LB_2$ is $\lambda$, the pitch of the interference fringes formed on the field stop is $P_{FS}$ and $\xi_0 = \lambda/2 \ P_{FS}$.

Figure 17:
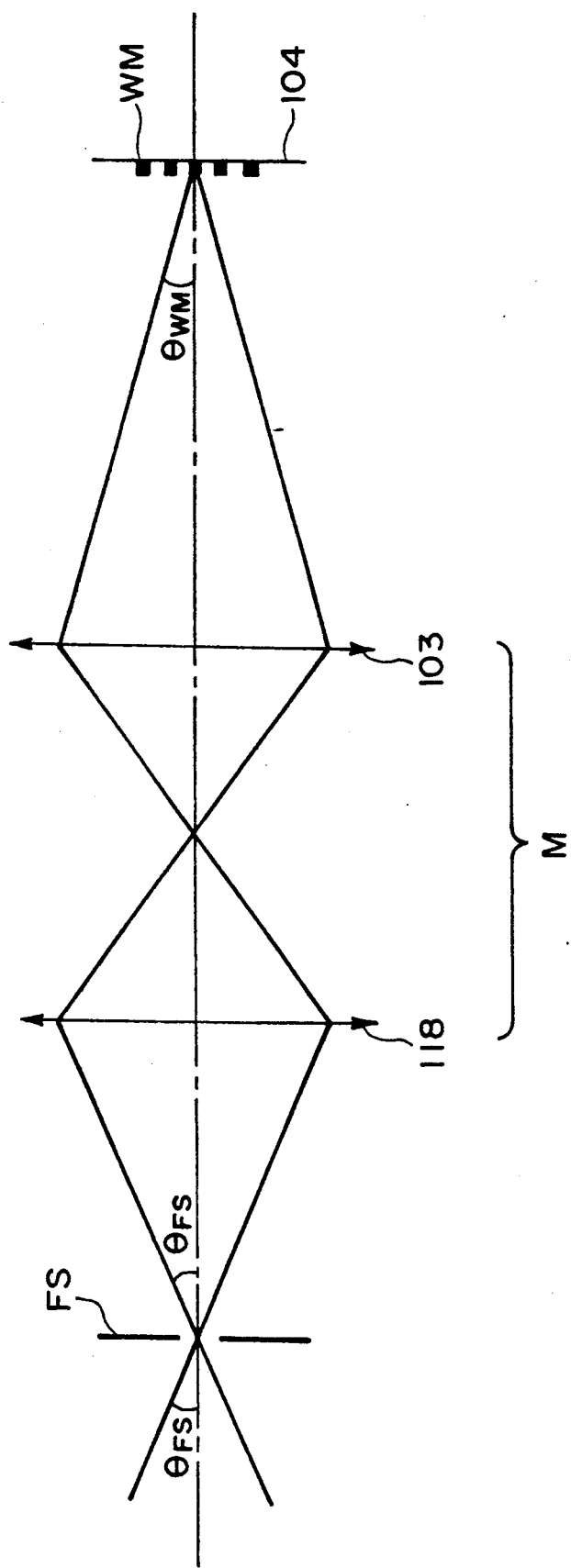
FIG. 17 illustrates the optical path showing the total magnifications of lenses.

Assuming that the lens 118 and the projecting lens 103 meet the sine condition as shown in FIG. 17, the synthetic magnification of the lens disposed between the field stop FS and the wafer becomes as follows:

$$M = \frac{\sin\theta_{FS}}{\sin\theta_{WM}} \quad (22)$$

Assuming that the pitch of the wafer mark WM is $P_{WM}$, the incident angle of each of the alignment light beam illuminating the diffraction grating mark WM on the wafer mark is $\theta w$ and sin $\theta w = \xi_0'$, detection of $\pm n$-order diffracted light from the wafer mark WM due to the alignment light $LB_1$ and $LB_2$ from Equation (22) gives the following relationship:

$$\xi_0 = M\xi_0' = nM\lambda/P_{WM}$$

$$P_{WM} = 2 \ nMP_{FS}$$

Therefore, Equation (21) can be expressed as follows:

$$b = A_0 \frac{P_{WM}^2 \sin[(2\pi n w M \cos^2\theta)/P_{WM}]}{2n^2\pi^2 M^2 w h \sin 2\theta} \times \sin[(2n\pi h M \tan\theta)/P_{WM}] \quad (23)$$

As is shown from Equations (21) and (23), the factors influencing the alignment accuracy can be removed by determining the most suitable range of the edge inclination of the opening formed in the field stop FS.

Therefore, in order to make the numerator of Equation (23), the maximum value in consideration of the case in which the error included in the diffracted light becomes maximum, the value of the sine term is made 1. As a result, the following relationship is held from Equation (21):

$$\sin 2\theta = \frac{2P_{FS}^2}{\pi^2 wh} \cdot \frac{A_0}{b} \quad (24)$$

From Equation (23), the following equation can be obtained:

$$\sin 2\theta = \frac{P_{WM}^2}{2\pi^2 n^2 M^2 wh} \cdot \frac{A_0}{b} \quad (25)$$

For example, in order to secure the alignment accuracy better than 0.02 μm on the wafer, it is assumed that $b/A_0 \leq 0.016$, the synthetic magnification of the lens disposed between the field stop FS and the wafer is 1 ($\theta_w = \theta_{FS}$), the detected diffracted light is ±1-order diffracted light, the pitch PWM ($=2P_{FS}$) of the diffraction grating mark WM on the wafer is 8 μm, the length W of the longitudinal edge of the field stop FS is 50 μm, and the length h of the lateral edge perpendicular to the longitudinal edge is 30 μm. As a result, inclination $\theta$ of the lateral edge becomes $\theta \geq 3.9°$ from Equations (24) and (25).

Therefore, in order to reduce the influence of noise diffracted light to be mixed into the alignment light $LB_1$ and $LB_2$, the edges e3 and e4 of the opening must be arranged so as to meet $\theta \geq 3.9°$.

In general, a satisfactory alignment accuracy can be secured by providing a field stop FS having an edge inclination $\theta$ with which the value of the right side of Equation (24) or (25) exceeds the value of the left side of the same.

Assuming that A is $A_0$, $X_{WM}$ is allowable alignment error (μm) on the wafer and Xe of Equation (16) is $X_{WM}$, the following equation can be obtained:

$$\frac{A_0}{b} = \frac{P_{WM}}{2\pi X_{WM}} \quad (26)$$

Therefore, the following equations can be deduced from Equations (24) to (26):

$$\sin 2\theta \geq \frac{P_{FS}^2 P_{WM}}{\pi^3 wh X_{WM}} \quad (27)$$

$$\sin 2\theta \geq \frac{P_{WM}^3}{4\pi^3 n^2 M^2 wh X_{WM}} \quad (28)$$

In the case where the field stop having the opening which meets Equations (27) and (28) is provided in an alignment optical system, the influence of the diffracted light $1b_1'$ and $1b_2'$ generated in the direction of the optical axis and due to the field stop FS is not taken into consideration. Therefore, it is preferable that, for example, a light shield member 150 which allows only 0-order light to pass through as shown by a dashed line of FIG. 8 be provided in an optical path at a position more adjacent to the wafer than the position of the field stop FS in the alignment optical system. As a result, the alignment accuracy better than $X_{WM}$ (μm) on the wafer can be assured.

Then, in order to reduce the influence of the diffracted light $1b_1'$ and $1b_2'$, generated in the direction of the optical axis due to the field stop, the influence of the noise diffracted light which enters the optical path on the optical axis is obtained by arranging $\xi = 0$ and $\eta = 0$ in Equation (20). Similarly to Equations (24) and (25), making the numerator of Equation (20) the maximum value, that is making the value of sine term 1 gives the following equations:

$$\sin 2\theta = \frac{8P_{FS}^2}{\pi^2 wh} \cdot \frac{A_0}{b} \quad (29)$$

$$\sin 2\theta = \frac{2P_{WM}^2}{\pi^2 M^2 wh} \cdot \frac{A_0}{b} \quad (30)$$

where A0 represents the amplitude of either of the alignment light illuminating the field stop FS from two directions and b represents the amplitude of the noise diffracted light generated in the direction of the optical axis due to the field stop FS.

In order to eliminate the noise light, it is arranged such that A of Equation (15) is A0, Xe of Equation (16) is $X_{WM}$. As a result, Equations (29) and (30) can be expressed as follows from the above-described two equations:

$$\sin 2\theta \geq \frac{4P_{FS}^2 P_{WM}}{\pi^3 wh X_{WM}} \quad (31)$$

$$\sin 2\theta \geq \frac{P_{WM}^3}{\pi^3 n^2 M^2 wh X_{WM}} \quad (32)$$

Therefore, in general, the influence of the diffracted light $1b_1'$ and $1b_2'$, generated in the direction of the optical axis due to the field stop FS can be reduced by constituting the structure in such a manner that the edges e3 and e4 of the opening of the field stop FS are arranged to meet Equation (31) or (32). Furthermore, the noise diffracted light which can be mixed into the alignment light can be simultaneously reduced.

That is, when the field stop FS is arranged to meet Equation (31) or (32), all of the bad influence of noise diffracted light influencing on the optical beat signal to be detected can be eliminated.

For example, assuming that $M = 1$ ($\theta_{WM} = \theta_{FS}$), $P_{WM}$ ($=2P_{FS}$) = 8 μm, w = 50 μm, h = 30 μm and $X_{WM} \leq 0.02$ μm, a becomes $\theta \geq 16.7°$ from Equation (31) or (32). Therefore, the structure is necessary to meet this condition is thus obtained.

In the case where the edges of the field stop FS are arranged to meet Equation (31) or (32), the light shield member 150 shown in FIG. 8 can be omitted from the structure.

Now, a third embodiment of the present invention will be described.

In the case where the field stop is arranged in the form of a rectangular shape, the third term $2Ab \cos \omega t$ of Equation (12) directly influences the detected signal. The value of Ab can be expressed as follows from Equation (18):

$$Ab = A_0^2 \frac{\sin \pi w/\lambda(\xi + \xi_0)}{\pi w/\lambda(\xi + \xi_0)} \times \frac{\sin \pi w/\lambda(\xi - \xi_0)}{\pi w/\lambda(\xi - \xi_0)} \quad (33)$$

Figure 18:
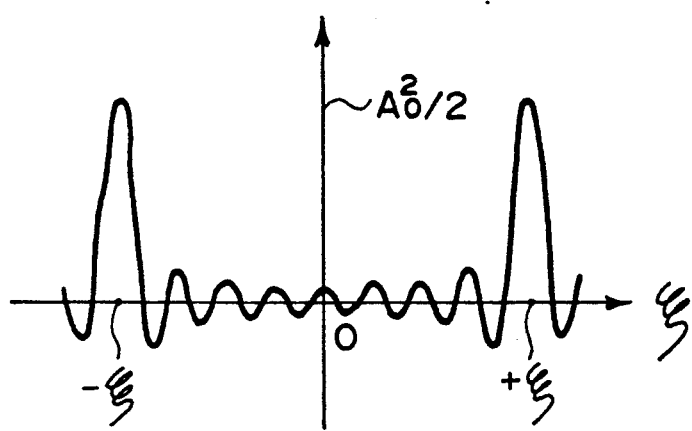
FIG. 18 is a graph which illustrates the values of Ab.

FIG. 18 is a graph which illustrates Equation (33). As shown in this drawing, there is no relationship with the movement of the wafer and the luminous flux which has passed through the position $\pm\xi$ on the pupil surface P of the projecting lens becomes the optical beat signal causing the maximum error.

When +1-order diffracted light is detected from the wafer mark WM assuming that the synthetic magnification of the lens disposed between the field stop FS and the wafer is M ($=\sin\theta_{FS}/\sin\theta_{WM}$) and the wavelength of the alignment light is $\lambda$, the pitch $P_{FS}$ of the interference fringes formed on the field stop FS becomes:

$$P_{FS} = \frac{\lambda}{2\sin\theta_{FS}} = \frac{\lambda}{2M\sin\theta_{WM}} = \frac{P_{WM}}{2M} \quad (34)$$

where $\sin\theta_{WM} = \lambda/P_{WM}$.

Figure 19:
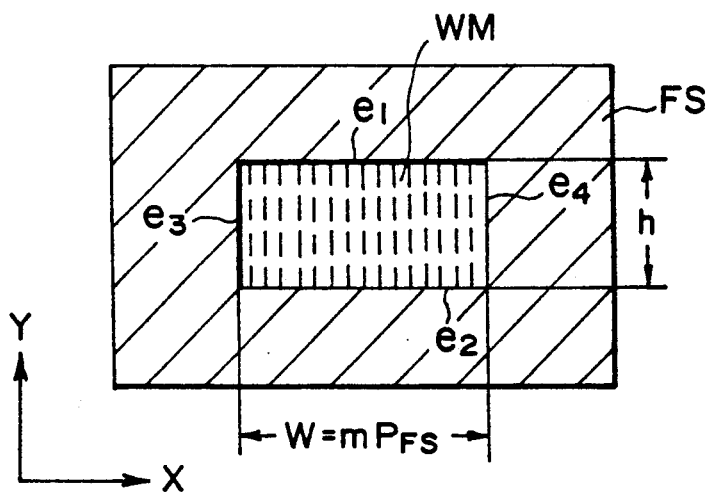
FIG. 19 is a plan view which illustrates the FS (Field Stop) according to a third embodiment.

As shown in FIG. 19, assuming that the length of the longitudinal edge corresponding to the direction of the arrangement of the wafer mark WM on the field stop FS having a rectangular opening is W and symbol m represents an integer, when the structure is arranged to meet $W = mP_{FS}$ ($=mP_{WM}/2M$), Equation (33) becomes:

$$Ab = A_0^2 \frac{\sin[\pi m P_{FS}(\xi + \xi_0)/\lambda]}{\pi m P_{FS}(\xi + \xi_0)/\lambda} \times \frac{\sin[\pi m P_{FS}(\xi - \xi_0)/\lambda]}{\pi m P_{FS}(\xi - \xi_0)/\lambda} \quad (35)$$

When the value of Ab at the position $+\xi_0$ ($=M\lambda/P_{WM}$) is obtained from Equation (35), it can be obtained as follows:

$$Ab = A_0^2 \frac{\sin[\pi m P_{FS}(\pm 2\xi_0)/\lambda]}{\pi m P_{FS}(\pm 2\xi_0)/\lambda} \times \frac{\sin[\pi m P_{FS}(\pm 2\xi_0)/\lambda]}{\pi m P_{FS}(\pm 2\xi_0)/\lambda}$$

$$= A_0^2 \times \frac{\sin[\pi m P_{WM}(\pm 2\lambda M/P_{WM})/2M\lambda]}{\pi m P_{WM}(\pm 2\lambda M/P_{WM})/2M\lambda} \times$$

$$\frac{\sin[\pi m P_{WM}(\pm 2\lambda M/P_{WM})/2M\lambda]}{\pi m P_{WM}(\pm 2\lambda M/P_{WM})/2M\lambda}$$

$$= A_0^2 \frac{\sin(\pm \pi m)}{\pm \pi m} \times \frac{\sin(\pm \pi m)}{\pm \pi m} = 0.$$

Figure 20:
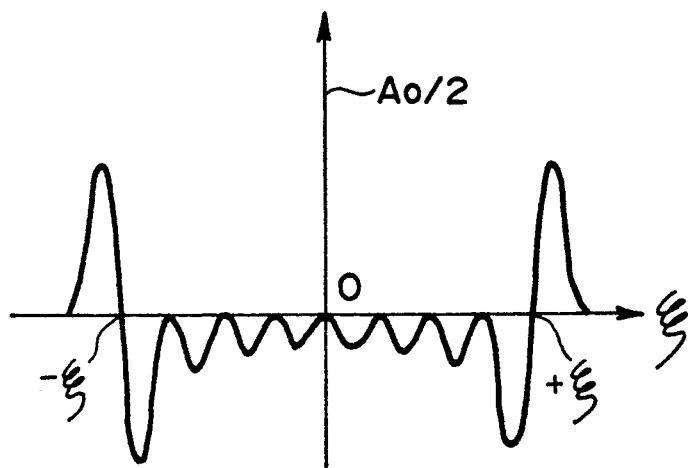
FIG. 20 is a graph which illustrates the values of Ab obtained in accordance with the third embodiment.

As shown in FIG. 20 which is a graph showing Equation (35), the positive sign and the negative sign of the value of Ab are inverted in the vicinity of $\pm\xi_0$ on the Fourier plane. Therefore, the influence of the noise light on the detector can be reduced. Although the $\pm 1$-order diffracted light from the wafer mark WM is detected according to the above-described embodiments, the present invention may, of course, be effectively applied to a case in which $\pm n$-order diffracted light from the wafer mark WM is detected.

According to this embodiment, the structure is so arranged that only the influence of the noise light which can be mixed into the alignment light $LB_1$ and $LB_2$ for illuminating the diffraction grating mark WM on the wafer from two directions at predetermined incident angles is intended to be reduced. Therefore, it is preferable as described earlier regarding FIG. 8, that a light shield member 150 which allows only alignment light $LB_1$ and $LB_2$ having the different frequencies from each other to pass through be disposed in an optical path closer to the wafer than the position of the field stop FS in the alignment optical system.

According to the above-described first to third embodiments, the optical beat signal including the positional information is detected from the wafer and the alignment is thus conducted in such a manner that the phase difference from a signal for driving the acoustooptical modulator (AOM) is made zero. Another structure may be employed in which reference light obtained by splitting alignment light beams $LB_1$ and $LB_2$ which have been frequency-modulated by the acoustooptical modulator by a beam splitter is photoelectrically detected and the alignment is conducted in such a manner that the phase difference between the above-described reference signal and the optical beat signal including the positional information from the wafer is made zero.

Figure 21:
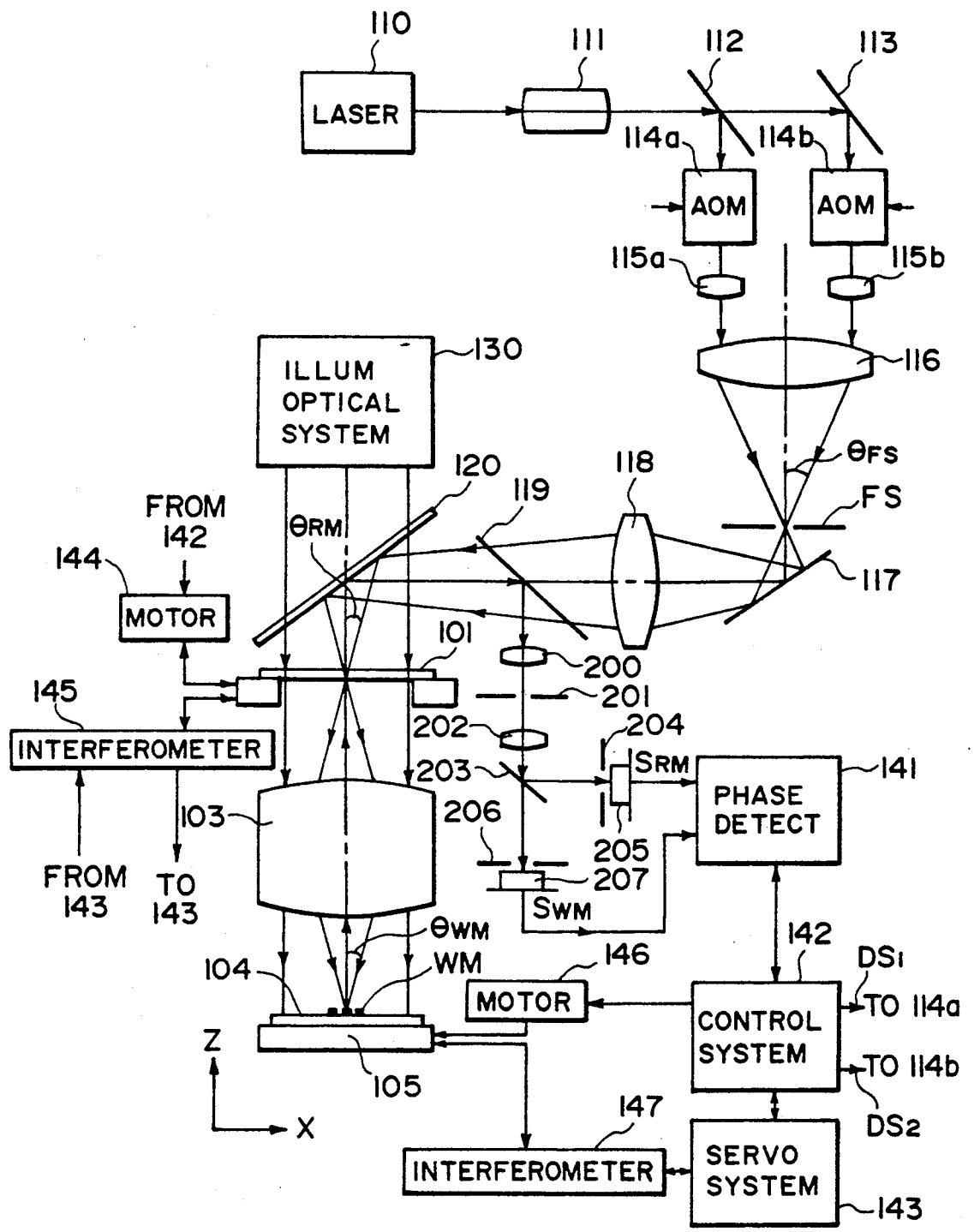
FIG. 21 is a schematic structure of a fourth embodiment of a projection exposing apparatus according to the present invention.

Now, a fourth embodiment of the present invention will be described with reference to FIG. 21. Referring to FIG. 21, the same elements as those shown in FIG. 8 are given the same reference numerals.

According to this embodiment, alignment light beams $LB_1$ and $LB_2$ are applied to the wafer via the reticle and the projecting lens so that an optical beat signal including the positional information from the reticle and an optical beat signal including the positional information from the wafer are photo-electrically detected so that the positional alignment between the reticle and the wafer is conducted.

The opening in the field stop FS in the alignment optical system is, as shown in FIG. 14, in the form of a parallelogram. The alignment light beams $LB_1$ and $LB_2$ which have passed through the field stop FS illuminate the diffraction grating mark RM on the reticle from two direction at predetermined incidental angles ($\pm\theta_{WM}$).

The relationship between the incident angles ($\pm\theta_{FS}$) when the alignment light $LB_1$ and $LB_2$ illuminates the field stop FS and the incident angle ($\pm\theta_{WM}$) when the same illuminates the reticle mark RM becomes as follows assuming that the imaging magnification of the lens 118 disposed between the field stop FS and the reticle is $m_1$ similar to the case shown in FIG. 17:

$$\pm\theta_{FS} = \pm m_1 \theta_{RM}$$

Figure 22A:
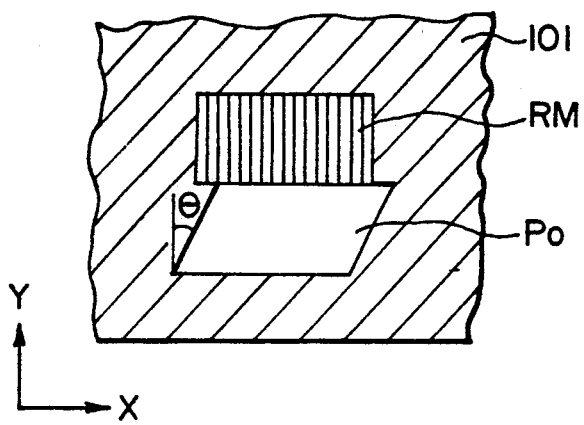
FIG. 22A is a plan view which illustrates the shape of a reticle mark RM.

As shown in FIG. 22A, a light transmissible opening P0 of a parallelogram having edges inclined by $\theta°$ is positioned neighboring to the reticle mark RM on the reticle similarly to the edges e3 and e4 of the above-described field stop FS. The alignment light illuminates the region which simultaneously covers the reticle mark RM and the opening P0.

The $\pm 1$-order diffracted light generated in the normal direction due to the alignment light beams $LB_1$ and $LB_2$ which have illuminated the reticle mark RM from two directions reaches a spatial filter 201 via the dichroic mirror 120, the beam splitter 119 and a lens 200.

The spatial filter is positioned in conjugation with the pupil of the projecting lens 103 and acts to allow only luminous fluxes passing in the direction of the optical axis to pass (only the $\pm 1$-order diffracted light from the reticle mark RM and the $\pm 1$-order diffracted light from the wafer mark WM to be described later). Thus, unnecessary luminous fluxes can be filtered.

The $\pm 1$-order diffracted light from the reticle mark RM passes through the spatial filter 201 and is reflected by a beam splitter 203. Then, it reaches a detector 205 via a mask member 204 at which an optical beat signal $S_{RM}$ including the positional information of the reticle is photo-electrically detected.

Figure 23A:
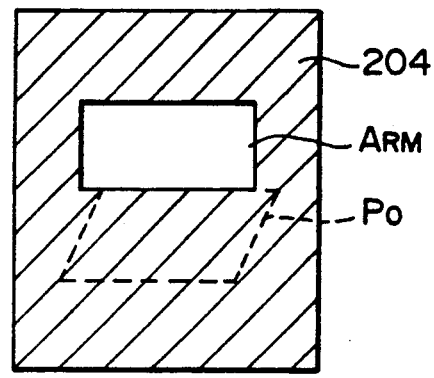
FIGS. 23A and 23B are plan views which respectively illustrate a mask member.

The mask member 204 is positioned in conjugation with the reticle and as shown in FIG. 23A, an opening $A_{RM}$ corresponding to the reticle mark is formed so that only ±1-order diffracted light from the reticle mark RM is allowed to pass through.

Figure 22B:
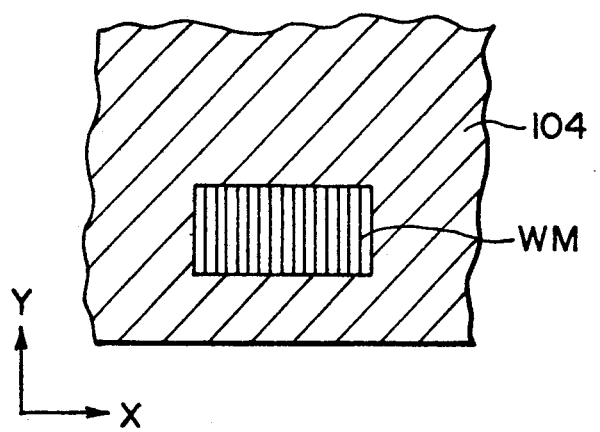
FIG. 22B is a plan view which illustrates the shape of a wafer mark WM.

On the other hand, the alignment light beams $LB_1$ and $LB_2$ which have passed through the opening P0 in the parallelogram shape shown in FIG. 22A illuminates the diffraction grating mark WM on the wafer via the projecting lens 103 at a predetermined incident angle $\theta_{WM}$ from two directions. The wafer mark WM is, as shown in FIG. 22B, positioned at a position corresponding to the reticle opening P0.

The relationship between the incident angles ($\pm\theta_{RM}$) when the alignment light $LB_1$ and $LB_2$ illuminates the reticle mark RM and the incident angle ($\pm\theta_{WM}$) when the same illuminates the wafer mark WM becomes as follows assuming that the imaging magnification of the lens 118 disposed between the field stop FS and the reticle is $m_2$ similarly to the case shown in FIG. 17:

$$\pm\theta_{RM} = \pm m_2 \theta_{WM}$$

The pitch of the reticle mark RM and that of the wafer mark WM hold the following relationship:

$$P_{WM} = m_2 P_{RM}$$

The ±1-order diffracted light generated in the normal direction of the wafer mark WM by the alignment light $LB_1$ and $LB_2$ illuminating the wafer mark with the above-described relationship about the incident angles again passes through the parallelogram opening P0. At this time, also 0-order diffracted light of the alignment light $LB_1$ and $LB_2$ which is regularly reflected and having the same ejection angle as the incident angle by the wafer mark is made incident upon the transmission opening P0 at an incident angle of $\pm\theta_{RM}$, and is again diffracted. Therefore, it can be considered that the ±1-order diffracted light receives a bad influence. Accordingly, the inclination q of the edge of the opening P0 according to this embodiment is determined so as to meet Equation (31) or (32) deduced in accordance with the above-described embodiments.

The ±1-order diffracted light which has passed through the parallelogram opening P0 reaches the detector 207 via the dichroic mirror 120, the beam splitter 119, the lens 200, the spatial filter 201, the lens 202, the beam splitter 203 and the mask member 206.

Figure 23B:
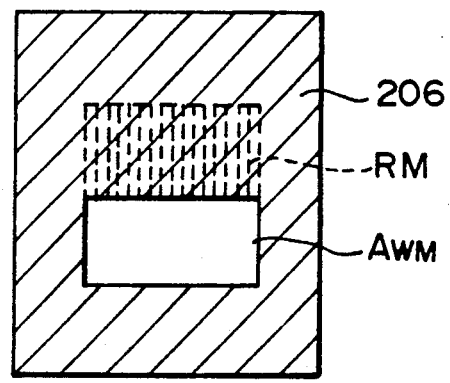

The mask member 206 is disposed at a conjugational position with the wafer and has an opening $A_{WM}$ corresponding to the wafer mark WM as shown in FIG. 23B so that only ±1-order diffracted light from the wafer mark is allowed to pass through.

As described above, the mixture of the noise diffracted light into the optical beat signals from the marks RM and WM is reduced by means of the field stop FS and the reticle opening P0, and the optical beat signals are independently detected by the detectors 205 and 207. Therefore, a reliable optical beat signal can be obtained, causing an accurate alignment to be obtained.

The shape of the field stop FS and that of the reticle opening P0 are not limited to the parallelogram. For example, a rhomboid or a trapezoid shape can be employed.

In the case where the noise diffracted light is mixed into the detected light, a mask member having an opening of the above-described shape or an opening having edges whose length is an intergral multiple of the pitch of the interference fringes may be positioned in conjugation with the wafer or the reticle in the detection system.

According to the above-described embodiments, a pair of alignment light beams are applied to both the reticle mark RM and the wafer mark WM from predetermined two directions and the optical beat signal of ±n-order diffracted light generated in parallel with the optical axis is detected by the detection system. The condition for generating the ±n-order diffracted light in the same direction is defined by the relationship between the incident angle of the pair of the alignment light beams and the pitch of the diffraction grating. According to the above-described embodiments, the alignment can be conducted even if the incident angle of the alignment light is not changed and only the pitch $P_{RM}$ of the diffraction grating forming the reticle mark is halved. That is, assuming that the pitch of the reticle mark RM is $P_{RM}'$, the following relationship is held:

$$P_{RM}' = \frac{\lambda}{2\sin\theta_{RM}}.$$

Therefore, the diffraction angle of the ±n-order diffracted light is doubled in accordance with the halving the pitch of the reticle mark.

FIG. 24 illustrates the above-described state. When the alignment light $LB_1$ illuminates the reticle mark RM at an incident angle $\theta_{RM}$, −1-order diffracted light $LB_1$ (−1) passing reversely through the optical path for the alignment light $LB_1$, 0-order diffracted light $LB_1$ (0), in direction $+2\theta_{RM}$ with respect to the direction of the passing of the diffracted light $LB_1$ (−1), +1-order diffracted light $LB_1$ (+1) in direction $+4\theta_{RM}$, and −2-order diffracted light $LB_1$ (−2) in direction $-2\theta_{RM}$ are respectively generated.

On the other hand, when the alignment light $LB_2$ illuminates the reticle mark RM at an incident angle $\theta_{RM}$, +1-order diffracted light $LB_2$ (+1) passing reversely through the optical path for the alignment light $LB_2$, 0-order diffracted light $LB_2$ (0) in direction $-2\theta_{RM}$ with respect to the direction of the passing of the diffracted light $LB_2$ (+1), −1-order diffracted light $LB_2$ (−1) in direction $-4\theta_{RM}$, and −2-order diffracted light $LB_2$ (+2) in direction $+2\theta_{RM}$ are respectively generated, where the diffracted light generated clockwise with respect to the 0-order light of the alignment light is arranged to be positive light, and that generated counterclockwise is negative light.

Therefore, diffracted light beams which have been diffracted by the reticle mark and pass in the same direction interfere with each other and each of the interference light is photo-electrically detected so that an optical beat signal including the positional information of the reticle can be obtained. Therefore, a beam splitter or the like is positioned in, for example, an optical path between the field stop FS and the reticle so as to separate $LB_2$ (+1) and the beat light due to $LB_1$ (0) into independent optical paths and a detector is positioned at a position in pupil-conjugation with the reticle. As a result, the beat light including the positional information of the reticle can be extremely accurately photo-electrically detected.

Although the heterodyne coherent type position detection apparatus has been described according to the above-described embodiments, the same effect can be expected from the homodyne coherent position detection apparatus. That is, a pair of alignment light beams having the same wavelength are applied to the diffraction grating mark from two directions so as to generate stationary interference fringes, and the alignment light and the diffraction grating mark are relatively moved so that the detection signal similar to that obtained from the heterodyne coherent position detection apparatus can be obtained.

Although the invention has been described in its preferred form with a certain degree of particularly, it is understood that the present disclosure of the preferred form may be changed in the details of construction and the combination and arrangement of parts to without departing from the spirit and the scope of the invention as hereinafter claimed.

We claim:

1. A position detection apparatus comprising:
a substrate having a diffraction grating;
means for supplying illuminating flux;
means for splitting said illuminating flux into two luminous fluxes;
means for modulating the frequency of at least one of said luminous fluxes by a predetermined value in order to obtain two luminous fluxes having frequencies that are different from each other;
means for causing the last-mentioned luminous fluxes to impinge upon said substrate in such a manner that they pass along independent optical paths and then are incident on said diffraction grating from different directions;
means for adjusting an intersection angle made by said two luminous fluxes incident on said diffraction grating;
means for adjusting the direction of arrangement of interference fringes generated on said diffraction grating by said two incident luminous fluxes, the last-mentioned adjusting means being disposed in at least one of said optical paths and including optical means which can be displaced for shifting a luminous flux received thereby in two directions orthogonal to each other; and
means for photo-electrically detecting an optical beat signal due to said interference fringes.

2. A position detection apparatus according to claim 1, wherein said optical means includes a parallel plane plate whose inclination angle can be varied about two axes orthogonal to each other.

* * * * *